United States Patent
Kido et al.

(10) Patent No.: US 8,558,451 B2
(45) Date of Patent: Oct. 15, 2013

(54) ORGANIC ELECTROLUMINESCENT DEVICE

(75) Inventors: Junji Kido, Yonezawa (JP); Toshio Matsumoto, Fujisawa (JP); Takeshi Nakada, Fujisawa (JP); Norifumi Kawamura, Fujisawa (JP)

(73) Assignees: Junji Kido, Yonezawa-shi (JP); Rohm Co. Ltd, Kyoto (JP)

( * ) Notice: Subject to any disclaimer, the term of this patent is extended or adjusted under 35 U.S.C. 154(b) by 704 days.

(21) Appl. No.: 10/966,251

(22) Filed: Oct. 15, 2004

(65) Prior Publication Data

US 2005/0084712 A1    Apr. 21, 2005

(30) Foreign Application Priority Data

Oct. 17, 2003   (JP) ................................ 2003-358402

(51) Int. Cl.
 *H01L 51/50*   (2006.01)
(52) U.S. Cl.
 USPC .......................................... 313/506; 313/504
(58) Field of Classification Search
 USPC .......................................................... 313/506
 See application file for complete search history.

(56) References Cited

U.S. PATENT DOCUMENTS

| | | | |
|---|---|---|---|
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,885,211 A | 12/1989 | Tang et al. | 428/457 |
| 5,059,862 A | 10/1991 | VanSlyke et al. | 313/503 |
| 5,925,980 A | 7/1999 | So et al. | 313/504 |
| 6,013,384 A | 1/2000 | Kido et al. | 428/690 |
| 6,195,142 B1 * | 2/2001 | Gyotoku et al. | 349/69 |
| 6,423,429 B2 | 7/2002 | Kido et al. | 428/690 |
| 6,589,673 B1 | 7/2003 | Kido et al. | 428/690 |
| 2003/0189401 A1 * | 10/2003 | Kido et al. | 313/504 |

FOREIGN PATENT DOCUMENTS

| | | |
|---|---|---|
| CN | 1447629 A | 10/2003 |
| EP | 1 351 558 A1 | 10/2003 |
| JO | 7-145116 | 6/1995 |
| JP | 64-49771 | 2/1989 |
| JP | 6-25659 | 2/1994 |
| JP | 6-203963 | 7/1994 |
| JP | 6-215874 | 8/1994 |
| JP | 7-97355 | 4/1995 |

(Continued)

OTHER PUBLICATIONS

"Organic electroluminescent diodes" C. W. Tang and S. A. VanSlyke, Appln. Phys. Lett. 51 (Sep. 21, 1987)., pp. 913-915.

(Continued)

*Primary Examiner* — Britt D Hanley
(74) *Attorney, Agent, or Firm* — McCormick, Paulding & Huber LLP

(57) ABSTRACT

An organic electroluminescent device includes an anode electrode layer; a cathode electrode layer opposed to the anode electrode layer; a hole injection layer provided adjacent to the anode electrode layer an organic structure including at least one light-emissive layer or at least one light-emissive unit having at least one light-emissive layer; between the anode electrode layer and the cathode electrode layer. At least one of the anode electrode layer and the cathode electrode layer is transparent. The hole injection layer includes a mixed layer of a metal oxide and an organic compound. The mixed layer is formed upon co-deposition of the metal oxide and the organic compound.

16 Claims, 32 Drawing Sheets

(56) References Cited

FOREIGN PATENT DOCUMENTS

| | | |
|---|---|---|
| JP | 7-101911 | 4/1995 |
| JP | 7-126225 | 5/1995 |
| JP | 7-126226 | 5/1995 |
| JP | 7-157473 | 6/1995 |
| JP | 7-188130 | 7/1995 |
| JP | 7-224012 | 8/1995 |
| JP | 8-40995 | 2/1996 |
| JP | 8-40996 | 2/1996 |
| JP | 8-40997 | 2/1996 |
| JP | 8-48656 | 2/1996 |
| JP | 09-063771 | 3/1997 |
| JP | 2824411 | 9/1998 |
| JP | 10-270171 | 10/1998 |
| JP | 11-233262 | 8/1999 |
| JP | 11-251067 | 9/1999 |
| JP | 2000-054176 | 2/2000 |
| JP | 2000-182774 | 6/2000 |
| JP | 2001-142627 | 5/2001 |
| JP | 2001-244079 | 9/2001 |
| JP | 2002313583 A | 10/2002 |
| JP | 2002-332567 | 11/2002 |
| JP | 2003272860 A | 9/2003 |
| WO | 2005/031798 A2 | 3/2005 |

OTHER PUBLICATIONS

CRC Handbook of Chemistry & Physics, 64$^{th}$ Ed.
Toppan Printing Co. (cf. 51$^{st}$. Periodical Meeting, Japanese Society of Applied Physics, Preprint 28a-PB-4 p. 1040.
Pioneer Co. (cf. 54$^{th}$ Periodical Meeting, Japanese Society of Applied Physics, Preprint 29p-ZC-15 p. 1127).
"Bright Organic Electroluminescent Devices with Double-Layer Cathode", J. Kido, et al., IEEE Transactions on Electron Devices, vol. 40, No. 7, Jul. 1993, pp. 1342-1344.
"Bright organic electroluminescent devices having a metal-doped electron-injecting layer", J. Kido, et al., Applied Physics Letters, vol. 73, Nov. 1998, No. 20, pp. 2866-2868.
The 10$^{th}$ International Workshop in Inorganic and Organic Electroluminescence (EL '00), Dec. 2000, pp. 297-300.
Japanese Journal of Applied Physics, Nov. 15, 1999, vol. 38 No. 11B, Ref. 12, "Lithium Carboxylate Ultranthin Film on an Aluminum Cathode for Enhanced Electron Injection in Organic Electroluminescent Devices", L1348-L1350.
Jpn. J. Appln. Phys. vol. 41 (2002), pp. L800, pp. L358-L360, L800-L803.
Appln. Phys. Lett 70 (2) Published Jan. 13, 1997 entitled "Enhanced electron injection in organic electroluminescence devices using an Al/ LiF electrode", L. S. Hung et al., pp. 152-154.
IEEE Trans. Electron Devices, vol. 44, No. 8, p. 1245 (1997) entitled "Organic EL Cells Using Alkaline Metal Compounds as Electron Injection Materials", Takeo Wakimoto, et al., pp. 1245-1248.
Appln. Phys. Lett. 65 (7), Aug. 15, 1994, Multilayered organic electroluminescent device using a novel starburst molecule, 4,4',4"-tris(3-methylphenylphenylamino)triphenylamine, as a hole transport material, Yasuhiko Shirota, et al., p. 807-809.
Preprint of 47$^{th}$ Periodical Meeting of Japanese Societyof Polymer Science, Japan, vol. 47, No. 9 (1998), p. 1940-1941.
European Search Report for EP 04 02 4610 dated Mar. 1, 2006.
"Metal oxides as a hole-injecting layer for an organic electroluminescent device". S. Tokito et al., Toyota Central Research and Development Laboratories, Inc., Nov. 14, 1996, pp. 2750-2753.

* cited by examiner

ORGANIC ELECTROLUMINESCENT DEVICE

CROSS REFERENCE TO RELATED APPLICATION

The present application is related to and claims priority of the following priority application, namely, Japanese patent application number 2003-358402 filed on Oct. 17, 2003 and incorporates by reference said priority application herein.

BACKGROUND OF THE INVENTION

1. Field of the Invention

The present invention relates to an organic electroluminescent device (hereinafter, abbreviated as an "organic EL device") which can be used as a planar light source or as a display device.

2. Description of the Related Art

Attention has been made to an organic electroluminescent device in which a light-emissive layer is constituted from an organic compound, because such a device can ensure a large area display at a low driving voltage. To highly increase the efficiency of organic EL devices, Tang et al. of Eastman Kodak Company, as is disclosed in Appl. Phys. Lett., 51, 913 (1987), have successfully achieved an EL device which can exhibit a high luminance and sufficient efficiency during practical use, i.e., a luminance of 1,000 cd/m$^2$ and an external quantum efficiency of 1% at an applied voltage of not more than 10 volts, when the EL device produced has a structure in which organic compound layers having different carrier transporting properties are laminated to thereby introduce holes and electrons with a good balance from an anode electrode layer and a cathode electrode layer, respectively, and the thickness of the organic compound layers is controlled to be not more than 2,000 Å.

In the development of such high efficiency EL devices, it has been already acknowledged that the technology for introducing electrons from a cathode electrode layer and holes from an anode electrode layer into an organic layer of the EL devices without generating an energy barrier is important. In Tang et al., described above, to reduce an energy barrier which can cause a problem when electrons are introduced from a metal electrode to an organic compound which is generally considered to be an electrically insulating material, magnesium (Mg) having a low work function (3.6 eV: 1 eV=1.60218×10$^{-19}$ J) is used. The work function referred to herein is based on the data described in CRC Handbook of Chemistry and Physics, 64$^{th}$ Edition. However, since magnesium is liable to be oxidized and instable and also has poor adhesion to the surface of the organic material, Tang et al. have suggested to use magnesium alloyed with silver (Ag: work function of 4.6 eV), since silver is relatively stable, and thus has a high work function and good adhesion to the surface of the organic material. Magnesium and silver are co-deposited to form an alloy. Reference should be made to the Kodak patents concerning organic EL devices, because the history until Tang et al. developed the use of the magnesium alloy is described therein in detail.

Referring to Kodak patents, the initially issued Kodak patents such as U.S. Pat. Nos. 4,356,429 and 4,539,507 teach that the low work function metal useful in the formation of a cathode electrode layer of the organic EL devices includes Al, In, Ag, Sn, Pb, Mg, Mn, and the like. Namely, the low work function metal is not defined with reference to its work function values in these patents. Recently issued Kodak patents such as U.S. Pat. Nos. 4,885,211, 4,720,432 and 5,059,862 teach that the required driving voltage can be lowered with reduction of the work function of the metal used in the cathode electrode layer. Moreover, it is also disclosed that the low work function metal is defined as a metal having a work function of less than 4.0 eV and any metal having a work function greater than 4.0 eV can be used as a mixture with the low work function metal having a work function of less than 4.0 eV which is rather chemically instable, to form their alloy, thereby giving a chemical stability to the resulting alloyed cathode electrode layer.

The stabilizing metal is referred to as a higher work function second metal, and candidate examples thereof include Al, Ag, Sn and Pb which are described as the low work function metal in the initial Kodak patents cited above. The inconsistencies in the disclosures between the initial and later patents show that the Kodak patents have been invented as a result of repeated trial and error at the initial stage of development. Furthermore, in the Kodak patents described above, it is disclosed that the alkaline metals having the lowest work function, should be removed from the candidate examples of the cathode metal, even though they can exhibit excellent function in principle, because they have an excessively high reactivity for achieving the stable driving of the EL devices.

On the other hand, a group of researchers of Toppan Printing Co. (cf. 51st periodical meeting, Society of Applied Physics, Preprint 28a-PB-4, p. 1040) and a group of researchers of Pioneer Co. (cf. 54th periodical meeting, Society of Applied Physics, Preprint 29p-ZC-15, p. 1127) have discovered that if lithium (Li; work function: 2.9 eV), which is an alkaline metal and has a lower work function than that of Mg, and was excluded from the claims of the Kodak patents, is used and is alloyed with aluminum (Al: work function: 4.2 eV) to form a stabilized electron injection cathode electrode layer, a lower driving voltage and a higher emissive luminance in comparison with those of the EL device using the Mg—Ag alloy can be obtained in the EL devices. Furthermore, as is reported in IEEE Trans. Electron Devices, 40, 1342 (1993), the inventors of the present invention have found that a two-layered cathode electrode layer produced by depositing lithium (Li) alone at a very small thickness of about 10 Å on an organic compound layer, followed by laminating silver (Ag) onto the deposited Li layer is effective to accomplish a low driving voltage in EL devices.

In addition, recently, the inventors of the present invention have successfully found, as is reported in Appl. Phys. Lett., 73 (1998) 2866, "SID97DIGEST, p. 775", Japanese Unexamined Patent Publication (Kokai) No. 10-270171 and the US counterpart thereof, U.S. Pat. No. 6,013,384, that in EL devices, if an alkaline metal such as lithium, an alkaline earth metal such as strontium or a rare earth metal such as samarium are doped into an organic layer adjacent to the cathode electrode layer in place of doping the same into the metal of the cathode electrode layer, a driving voltage can be reduced. This is considered to be because an organic molecule in the organic layer adjacent to the electrode is changed to the corresponding radical anion as the function of metal doping, thus largely reducing a barrier level to the electron injection from the cathode electrode layer. In this case, even if a higher work function metal having a work function greater than 4.0 eV such as aluminum is used as the metal of the cathode electrode layer, it becomes possible to reduce a driving voltage in EL devices. In addition, it has been confirmed as disclosed in Japanese Unexamined Patent Publication (Kokai) No. 2002-332567 that higher work function electrode materials such as ITO, which are conventionally used in the formation of the anode electrode layer and are considered to be the most undesirable for the formation of the cathode electrode layer, can be used as a cathode material to provide a drivable light-emissive device.

Moreover, the inventors of the present invention have proposed organic EL devices in Japanese Unexamined Patent Publication (Kokai) Nos. 11-233262 and 2000-182774. These EL devices are characterized in that an organic layer in a portion adjacent to the cathode electrode layer is formed from an organometallic complex compound containing at least one metal ion of an alkaline metal ion, an alkaline earth metal ion and a rare earth metal ion or is formed from a mixed layer of the organometallic complex compound and an electron-transporting organic compound and the cathode electrode layer is formed from the electrode material which includes a thermally reducible metal capable of reducing an alkaline metal ion, an alkaline earth metal ion and a rare earth metal ion, contained in the organometallic complex compound in the mixed layer, in vacuum, to the corresponding metal (cf. The $10^{th}$ International Workshop on Inorganic and Organic Electroluminescence, p. 61; Jpn. J. Appl., phys., Vol. 38(1999) L1348, Part 2, No. 11B, 15 November, Reference 12; Jpn. J. Appl., Phys., Vol. 41(2002) pp. L800).

In the electron, injection layer having the above structure, during vapor deposition of the thermally reducible metals such as aluminum and zirconium under a vacuum, the thermally reducible metals can be vaporized in atomized state, i.e., in highly reactive conditions, and be deposited onto the organometallic complex compound, thereby reducing metal ions in the complex compound to the corresponding metal state and liberating the reduced metals therein. Furthermore, the reduced and liberated metals can cause an in-situ doping and reduction of the electron-transporting organic compound existing near the reduced and liberated metals (the reduction caused herein means the reduction defined by Lewis and thus acceptance of electrons). Accordingly, as in the above-described direct metal doping process, the electron-transporting organic compound can be changed to radical anions. Namely, according to this method, aluminum is selected, not by its level of the work function as in the conventional methods, but by the thermally reducible ability under vacuum conditions. Furthermore, a similar phenomenon has been observed and reported with regard to inorganic compounds containing a low work function metal ion such as alkaline metal ions (cf. Appl. Phys. Lett., Vol. 70, p. 152 (1997); and IEEE Trans. Electron Devices, Vol. 44, No. 8, p. 1245 (1997)).

As can be appreciated from the above-described historical descriptions of the electron injection technologies, in the development of organic EL devices, there have been continuous attempts to improve the electron injection electrodes and improve the method of forming an electron injection layer in an interface with the cathode electrode layer. As a result, the emission efficiency of the EL devices could be drastically improved and also it became possible to drive the EL devices at a low voltage. Accordingly, at present, the electron injection has been recognized to be important technologies for improving the EL device properties in the production of the organic EL devices.

Moreover, for the injection of holes into the organic layer, an indium-tin-oxide (ITO) is widely used as a transparent oxide electrode material having relatively higher work function in the formation of an anode electrode layer in the organic EL devices. ITO has been already widely used in the production of the liquid crystal display devices, and under this circumstance, it can be said that suitability of transparent electrode like ITO for EL devices is considered to be a result of the unexpected luck, because ITO is a material which is relatively appropriate for the hole injection into the organic layer because of its higher work function and also, without saying, light has to be extracted plane-wise in the EL devices. In addition to that, ITO is widely available now because LCD industry uses ITO coated glass substrate in its mass production scale.

Furthermore, Tang et al. of Eastman Kodak Company have further improved compatibility of organic layer with an anode electrode layer by inserting a layer of copper phthalocyanine (hereinafter, CuPc) having a thickness of not more than 200 Å between the anode electrode layer and the hole-transporting organic compound, thereby enabling the operation of the EL devices at a low voltage and at a more stable state (cf. Kodak patents, cited above). Furthermore, a group of researchers of Pioneer Co., Ltd., have obtained similar effects by using star-burst type arylamine compounds proposed by Shirota et al., of Osaka University (cf. Appl. Phys. Lett., 65, 807 (1994)). Both of the CuPc and the star-burst arylamine compounds have the characteristic of having an ionization potential (Ip) smaller than that of ITO and their hole mobility is relatively large, and thus they can improve stability of the EL device during continuous driving, as a function of improved interfacial compatibility, in addition to low-voltage driven property.

In addition, a group of the researchers of Toyota CRDL, Inc., have proposed an organic EL device in which a metal oxide such as vanadium oxide ($VO_x$), ruthenium oxide ($RuO_x$) or molybdenum oxide ($MoO_x$), which have a larger work function than ITO, is deposited at a thickness of 50 to 300 Å by sputtering on an ITO layer to thereby reduce an energy barrier generated during hole injection from the ITO layer (anode electrode layer) to the organic layer (cf. Japanese Patent No. 2824411). In this EL device, the driving voltage can be considerably reduced in comparison with the sole use of ITO.

Similarly, the assignee of the present invention, as is disclosed in Japanese Patent Application Laid-open Nos. 10-49771 (Japanese Patent Application Laid-open No. 11-251067 (corresponding U.S. Pat. No. 6,423,429B2) and 2001-244079 (corresponding U.S. Pat. No. 6,589,673 B1), has succeeded with regard to hole injection from the anode electrode layer in improving the hole injection property of a EL device if a sort of a Lewis acid compound and an organic hole-transporting compound are properly selected and are mixed in a appropriate ratio using a co-deposition method to form a hole injection layer (cf. Jpn. J. Appl. Phys., Vol. 41(2002) L358).

In this EL device, since a Lewis acid compound capable of acting as an oxidation agent for the organic compound is being doped into a layer of the organic compound adjacent to the anode electrode layer, the organic compound is retained as molecules in the oxidized state and as a result, an energy barrier during hole injection can be reduced, thereby ensuring to further reduce a driving voltage of the EL devices in comparison to the prior art EL devices. Moreover, if a suitable combination of the organic compound and the Lewis acid compound is selected in this chemical doping layer, an increase of the driving voltage can be avoided, even if a thickness of this layer is increased to an order of micrometers, in contrast to the prior art layer constituted from only undoped organic compounds, and thus a dependency of the driving voltage upon the layer thickness of the chemical doping layer can be removed in the EL devices (cf. Preprint of 47th periodical meeting of Japanese Society of Polymer, Vol. 47, No. 9, p. 1940 (1998)). In addition, as is disclosed in Japanese Unexamined Patent Publication (Kokai) No. 2001-244079 (Japanese Patent Application No. 2000-54176), the above-described Lewis acid-doping layer may be used to adjust an optical path length of the EL device to thereby enable the layer to act as a controlling layer of an emission spectrum profile which can be utilized to improve a color purity of the display image.

Regarding the above-described hole injection technologies, their features and drawbacks will be summarized as follows. First, the hole injection layer having mixed therein a Lewis acid compound, suggested by the assignee of the present invention, has characteristics which could not be observed in other hole injection layers such as the characteristic that a driving voltage of the EL devices is not substantially increased along with the increase of the thickness of the hole injection layer because of the low resistivity of the hole injection layer, and the layer is considered to be the most effective hole injection layer among the available hole injection layers. On the other hand, generally, many of the Lewis acid compounds are chemically instable and therefore they suffer from poor storage stability. Further, the inventors of the present invention have found that the Lewis acid compounds may slightly deteriorate the current efficiency (or quantum efficiency) of the EL devices. Similarly, the inventors of the present invention have found that the hole injection layer cannot act as a buffer layer for reducing a process damage during formation of the electrode layers. The hole injection layer using an organic compound having a small ionization potential, suggested by Tang et al. and Shirota et al., can improve a compatibility with the anode electrode layer, however, due to the upper limit of the applicable layer thickness, a layer design (including layer thickness) of the EL devices cannot be unlimitedly changed.

Similarly, the lamination of a metal oxide having a large work function on the anode electrode layer, suggested by Toyota CRDL Inc., suffers from limitation in the applicable layer thickness due to low light transmittance of the metal oxide, and the limitation that substantially all of the exemplified compounds can only be deposited with a sputtering method.

In any case, hitherto, the hole injection layer of the present invention has not yet been suggested which is characterized by having no layer thickness dependency of the driving voltage because of a low resistivity of the hole injection layer, enabling a maintenance of the high current efficiency (quantum efficiency) and having a property or function as a process damage-diminishing layer during formation of the electrode layers, in addition to the function as the hole injection layer.

SUMMARY OF THE INVENTION

The present invention is devised in view of the above-described problems of the prior art organic EL devices. The object of the present invention is to lower a driving voltage of the EL device by reducing an energy barrier generated during injection of holes from an anode electrode layer to an organic compound layer in the EL device, and at the same time, by utilizing the much lower resistivity of the hole injection layer, newly introduced into the EL device in accordance with the present invention, on different scales than that of other available organic layers, to control a layer thickness of the hole injection layer without being substantially restrained by its upper limit, thereby largely diminishing a risk of the electrical short circuit between the cathode electrode layer and the anode electrode layer without increasing a driving voltage.

Further, it is another object of the present invention to enable the hole injection layer which is a mixed layer of a metal oxide and an organic compound to act as a barrier for diminishing any damages due to high energy particles caused during the formation of electrodes using a sputtering method.

Furthermore, the inventors of the present invention have suggested an organic EL device having a novel structure which is different from the structure of prior art organic EL devices. This EL device is characterized in that two or more light-emissive units, which correspond to a portion of the layers sandwiched by the cathode electrode layer and the anode electrode layer in the prior art devices, are partitioned with a layer called a "charge-generation layer", and the charge-generation layer can act as a layer for generating holes and electrons during application of the voltage, thereby resulting in multiple and simultaneous light emission in the EL device as is observed when two or more prior art EL devices are connected in series.

In the above EL device, it was expected that the charge-generation layer can act as an electron injection layer or a hole injection layer when it is disposed in adjacent to the cathode electrode layer or the anode electrode layer, because the charge-generation layer can act as a hole injection layer to the light-emissive unit adjacent and disposed on a side of the cathode electrode layer thereof, and also the charge-generation layer can act as an electron injection layer to the light-emissive unit adjacent and disposed on a side of the anode electrode layer thereof. Accordingly, the present invention uses this structure of the charge-generation layer in a layer adjacent to the anode electrode layer, thereby enabling low voltage driving and stable driving of the EL devices.

Moreover, the present invention also provides an organic EL device without considering the work function of the electrodes (the anode electrode layer for the present invention), though such a work function was considered to be an important factor for controlling a driving voltage and a light emission efficiency in prior art EL devices. In other words, the present invention can widen a range of the selectivity of the electrode material in the formation of the anode electrode layer in the EL devices. Accordingly, in the EL devices of the present invention, any electrode materials can be used in the formation of the anode electrode layer as long as they have electrical conductivity. Generally, it is well-known to those skilled in the art that if the electrode is formed from a metal having a lower work function than that of ITO (about 5.0 eV), such as aluminum having a work function of about 4.2 eV, a driving voltage can be increased in the EL device, and also a driving stability of the EL devices can be deteriorated.

On the other hand, when the above-described mixed layer is used as a hole injection layer adjacent to the anode electrode layer in the EL device of the present invention, holes can be introduced into an organic structure including a light-emissive layer, in the absence of an energy barrier and regardless of the types of the electrode material used, during application of the voltage, because arylamines and other organic molecules are already in a radical cation state in the mixed layer.

The present invention is also devised in view of these circumstances, and thus the present invention disposes, adjacent to the anode electrode layer, a hole injection layer having a novel structure capable of diminishing an energy barrier generated during injection of holes from the anode electrode layer, thereby achieving an organic EL device having a low voltage drivability and a driving stability.

DESCRIPTION OF THE PREFERRED EMBODIMENTS

Figure 1:
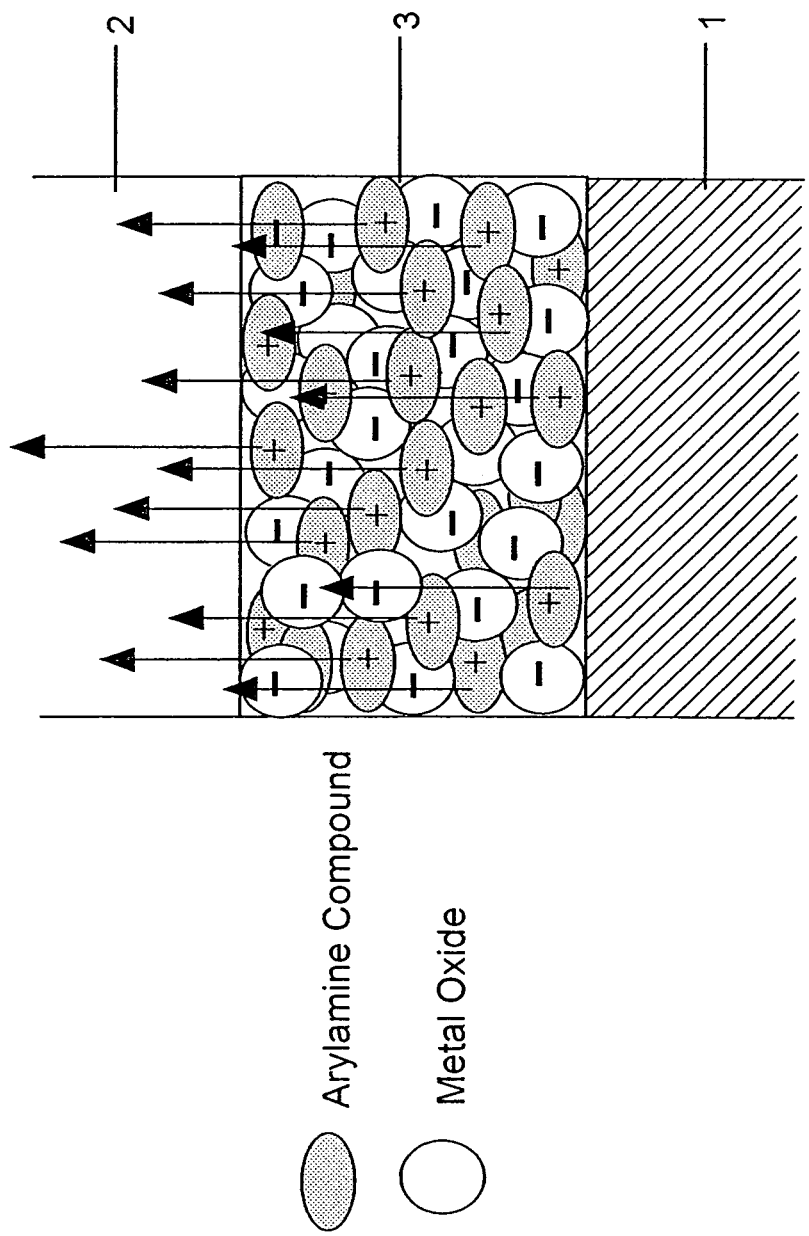
FIG. 1 is a schematic view of the hole injection layer illustrating a formation of the charge transfer complex and a transfer of holes during application of the voltage therein.

FIG. 1 is a schematic view showing the structure of the organic EL device according to an embodiment of the present invention. The illustrated EL device is characterized in that a hole injection layer 3 sandwiched between an anode electrode layer (anode) 1 and an organic structure 2 including a light-emissive layer has a mixed layer of a metal oxide and an organic compound, and these two compounds react with each other to make an oxidation-reduction reaction, thereby forming a charge transfer complex which has radical cations and radical anions. Namely, the mixed layer can act as a hole injection layer, because radical cations (holes) in the mixed layer are moved in the direction of an cathode electrode layer (cathode) of the EL device upon voltage application to the EL device.

Namely, in the organic EL device according to the described embodiment, the hole injection layer 3 includes:

an organic compound having an ionization potential of less than 5.7 eV and also showing a hole transporting property, i.e., electron-donating property; and a metal oxide capable of reacting with the organic compound (a) to make an oxidation-reduction reaction, and thus a charge transfer complex is produced upon the oxidation-reduction reaction between the organic compound (a) and the metal oxide (b).

Generally, it is desirable that the electron-donating organic compound (a) has an ionization potential of less than 5.7 eV, because such a small ionization potential enables the organic compound to be easily changed to the radical cation state. When the ionization potential of the organic compound is 5.7 eV or more, it becomes difficult to cause an oxidation-reduction reaction between the compound (a) and the metal oxide (b) and form a charge transfer complex of the present invention.

More specifically, the organic compound (a) is an arylamine compound, and the arylamine compound is preferably the arylamine compound represented by the following general formula (I):

wherein $Ar_1$, $Ar_2$ and $Ar_3$ each independently represents an aromatic hydrocarbon group which may be substituted with any substituent group.

Examples of the above-described arylamine compound include, but not restricted to, the arylamine compounds disclosed in, for example, Japanese Unexamined Patent Publication (Kokai) Nos. 6-25659, 6-203963, 6-215874, 7-145116, 7-224012, 7-157473, 848656, 7-126226, 7-188130, 840995, 840996, 8-40997, 7-126225, 7-101911 and 7-97355.

Typical examples of suitable arylamine compounds include N,N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostilbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino)styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4''-bis[N-(1-naphthyl)-N-phenylamino]p-terphenyl, 4,4'-bis[N-(2-naphtyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenyl, 4,4''-bis[N-(1-anthryl)-N-phenylamino]p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino) naphthalene, 2,6-bis[di-(1-naphthyl)amino]naphthalene, 2,6-bis[N-(1-naphthyl)-N-(2-naphthyl)amino]naphthalene, 4,4''-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)amino]biphenyl, 2,6-bis[N,N-di(2-naphthyl)amino]fluorene, 4,4''-bis(N,N-di-p-tolylamino) terphenyl, bis(N-1-naphthyl)(N-2-naphthyl)amine, 4,4'-bis [N-(2-naphthyl)-N-phenylamino]biphenyl (α-NPD) represented by the following formula (II):

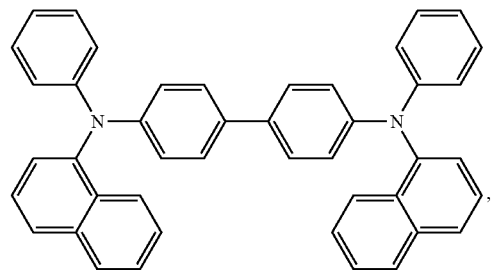

spiro-NPD represented by the following formula (III):

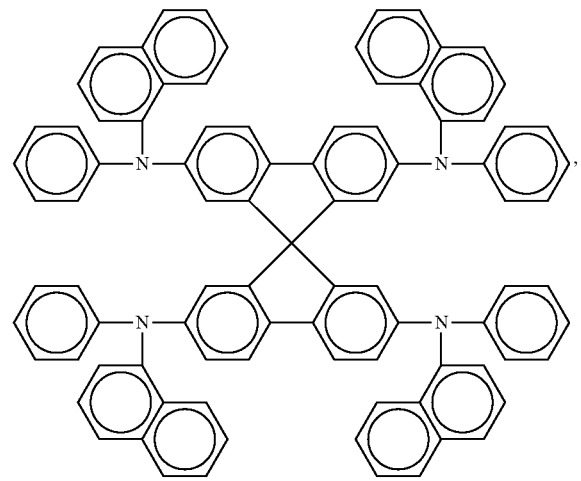

spiro-TAD represented by the following formula (IV):

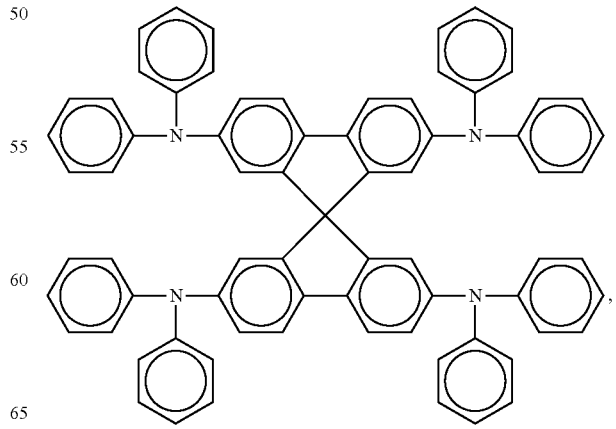

2-TNATA represented by the following formula (V):

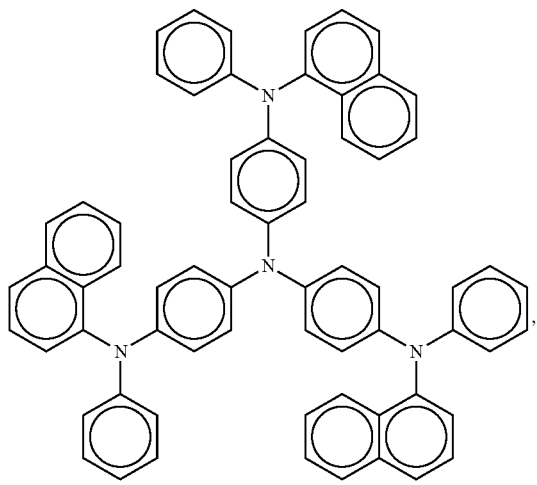

and others. Furthermore, any well-known arylamine compounds used in the production of the conventional organic EL devices may be suitably used.

Furthermore, from the viewpoint of thermal stability of the EL devices, it is desirable that the arylamine compound used herein is an arylamine compound having a glass transition temperature of not lower than 90° C.

Note that the arylamine compounds described above with reference to the formulae (II) to (V) are suitable examples of the arylamine compound having a glass transition temperature of not lower than 90° C.

Further, a porphyrin compound including a phthalocyanine derivative can be used as an organic compound that can be mixed with the metal oxide of the present invention.

Moreover, in the organic EL device according to the described embodiment, the most suitable example of the hole injection layer to be disposed adjacent to the anode electrode layer includes a mixed layer formed from an arylamine compound (a) and (b) a metal oxide capable of forming a charge transfer complex upon an oxidation-reduction reaction of this metal oxide with the arylamine compound (a).

Figure 2:
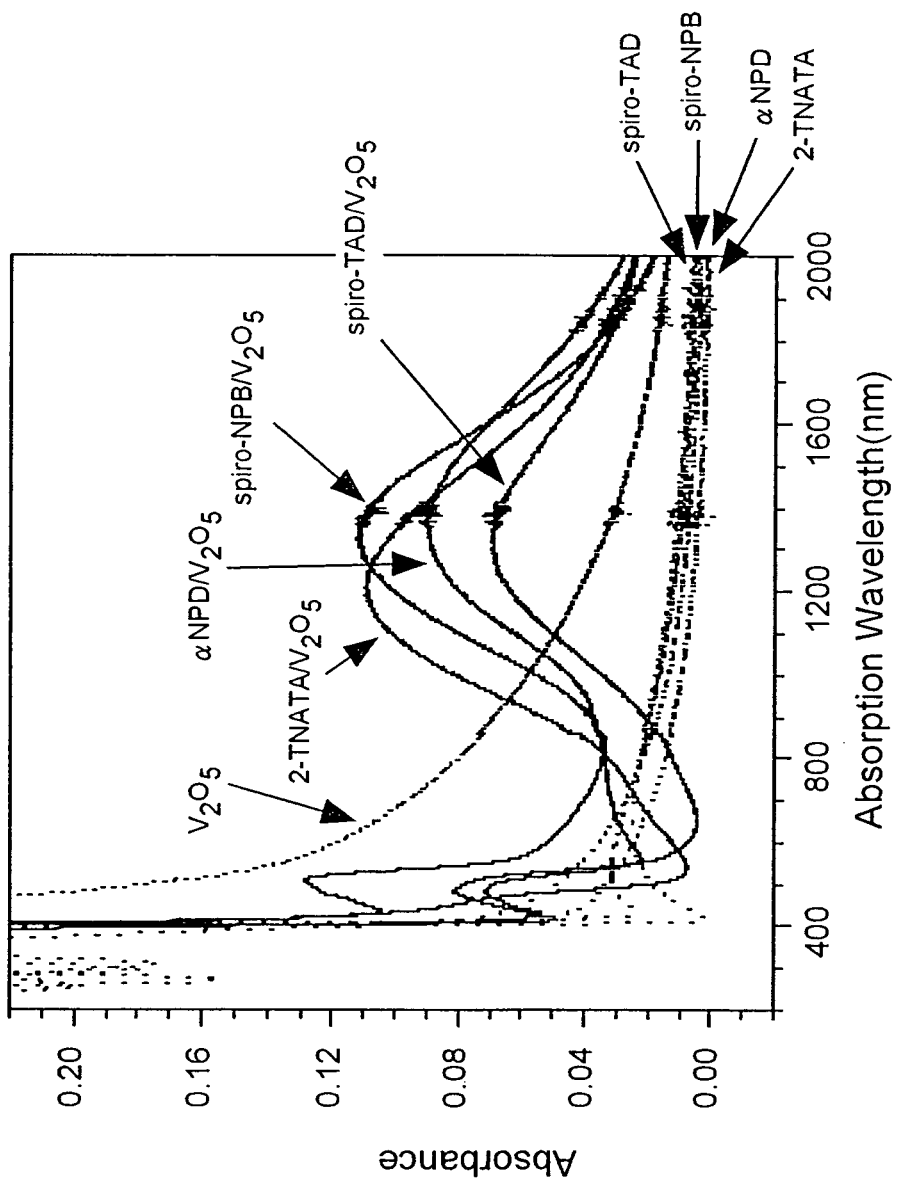
FIG. 2 is an absorption spectrum obtained with sole use of the arylamine compound, 2-TNATA, α-NPD, spiro-TAD or spiro-NPB, or the metal oxide, $V_2O_5$ (vanadium pentoxide), and the mixed layer of each arylamine compound and vanadium pentoxide.

In addition, in the above-described embodiment of the present invention, whether or not two types of the compounds used in the construction of the hole injection layer are forming a charge transfer complex upon an oxidation-reduction reaction between these compounds can be confirmed by comparing the absorption spectrum of each compound and its mixture. The absorption spectrum of the compounds can be measured using a spectroscopic analytical device (an absorption spectrum analysis). Referring to FIG. 2, two types of the compounds (arylamine compound and metal oxide, described above) are plotted regarding their absorption spectrums, and it is appreciated from the plotted graph that the arylamine compound and the metal oxide, when used alone, each cannot exhibit a peak of the absorption spectrum in a near IR region of about 800 to 2,000 nm, but the mixed layer of these compounds can exhibit a remarkable peak of the absorption spectrum in a near IR region of about 800 to 2,000 nm. These results prove that a charge transfer complex is produced in the mixed layer upon the oxidation-reduction reaction, accompanied by electron transfer, between these two types of the compounds.

Figure 3:
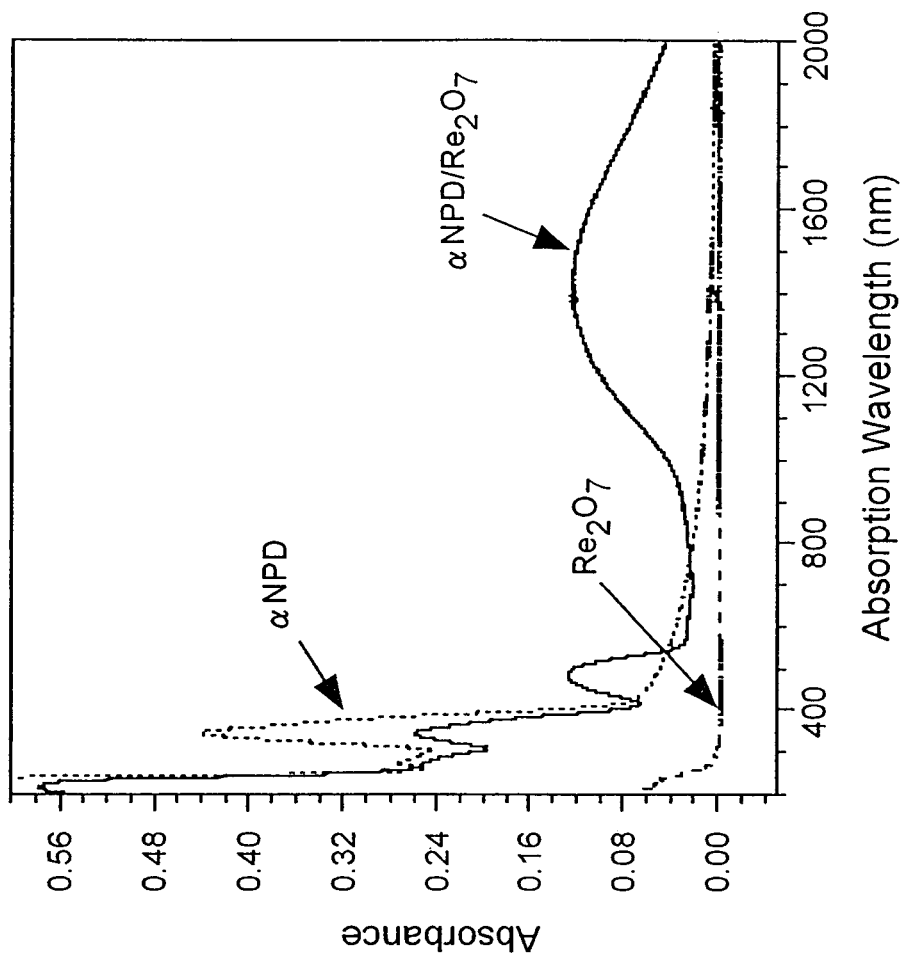
FIG. 3 is an absorption spectrum obtained with the mixed layer of α-NPD and $Re_2O_7$ (dirhenium heptoxide)

With regard to the absorption spectrums of the mixed layers plotted in FIGS. 2 and 3, it was observed that the absorption spectrum of each of the mixed layers is not a product of the simple accumulation of the spectrum of each of the compounds constituting the mixed layer, and the absorption spectrums of each mixture exhibit a third and/or new peak in a near IR region of about 800 to 2,000 nm. The inventors of the present invention have studied and found that the oxidation-reduction reaction generated in the mixed layer can facilitate a charge injection from the electrode in the EL devices upon the voltage application, and as a result, a driving voltage of the EL devices can be lowered.

In the organic EL device according to the described embodiment of the present invention, the layers constituting the EL device are laminated in accordance with layer formation sequence which is similar to that of conventional organic EL devices. Namely, on a glass substrate, an anode electrode layer, a hole injection layer, an organic structure including a light-emissive layer and a cathode electrode layer are laminated in this order. The cathode electrode layer may be formed from the metal or ITO using a layer formation method such as resistive heating vapor deposition or sputtering. In such a case, as is described in the following Example 3, aluminum is deposited on the substrate to form an anode electrode layer, followed by forming the mixed layer of the present invention as a hole injection layer, and finally ITO is deposited to form a transparent cathode electrode, thereby achieving an organic EL device having a top emission structure in which light is extracted from a layered surface side (ITO side) of the EL device. Generally, it has been recognized that aluminum (Al) is unsuitable for the formation of the hole injection electrode due to its low work function value. However, according to the present invention, if the proposed mixed layer is used as a hole injection layer, it becomes unexpectedly possible to eliminate the above limitation concerning use of low work function metals like Al.

Conversely, according to another embodiment of the present invention, the layers constituting the organic EL device can be laminated in accordance with layer formation sequence which is reverse to that of the conventional organic EL devices. Namely, on a substrate, a cathode electrode layer, an organic structure including a light-emissive layer, a hole injection layer and an anode electrode layer are laminated in this order. The anode electrode layer can be formed from the metal or ITO using a layer formation method such as resistive heating vapor deposition or sputtering, after formation of the hole injection layer. In this case, it is expected that hole injection layer (mixed layer) of the present invention can act as a damage-diminishing layer during formation of the anode electrode layer, particularly when the anode electrode layer is formed as a transparent ITO layer using a sputtering process. In fact, the effective function as the damage-diminishing layer of the hole injection layer is evidenced in Example 5, described below.

Moreover, in the specification attached to Japanese Patent Application No. 2001-142672, the inventors of the present invention have disclosed that a transparent and electrically conducting ITO layer acting as a cathode electrode layer can be formed on the metal-doped electron injection layer by using a sputtering method which is introduced for reducing a damage of the organic layer.

EXAMPLES

The present invention will be further described with reference to the working examples thereof. Note, however, that the present invention is not be restricted to these working examples. In the following examples, the layer formation of the organic compound, the metal oxide, the metal and the transparent ITO electrode were carried out by using the vapor deposition apparatus of Anelva Co., and the sputtering apparatus of FTS Corp. The control in the deposition rate of the vapor deposition material and in the thickness of the deposited layers were carried out by using a thickness monitor with a quartz oscillator, attached to the vapor deposition apparatus, "CRTM-8000" of ULVAC. Further, to determine an actual layer thickness after the layer formation, a stylus step meter, "P10" of Tencor Co. was used. Further, the characteristics of the organic EL device were evaluated with the source meter "2400" of KEITHLEY and the luminance meter "BM-8" of TOPCON. A DC voltage was stepwise applied at an increasing rate of 0.2 volts per 2 seconds to the EL device to determine the luminance and the electric current after lapse of one second from the completion of each increase of the voltage. In addition, the spectrum of the EL device was determined by using the optical multi-channel analyzer, "PMA-11" of HAMAMATSU PHOTONICS, driven at a constant electric current.

Reference Example

Figure 4:
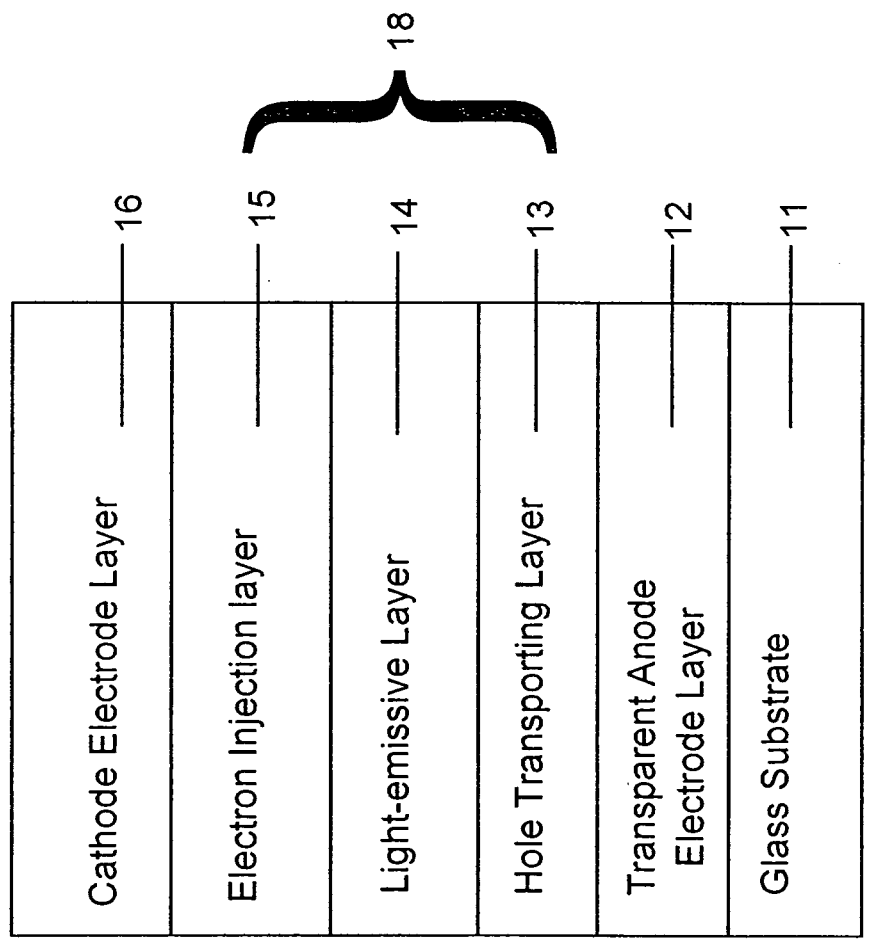
FIG. 4 is a schematic view showing the lamination structure of the organic EL device according to a Reference Example.

In this reference example, the prior art organic EL device having the lamination structure of FIG. 4 was produced.

A glass substrate 11 has coated thereon an ITO (indium-tin oxide; Nippon Sheet Glass Co., Ltd.) having a sheet resistance of about 10Ω/□ as a transparent anode electrode layer 12. Alpha(α)-NPD having a hole transporting property (electron-donating property), represented by the following formula (II):

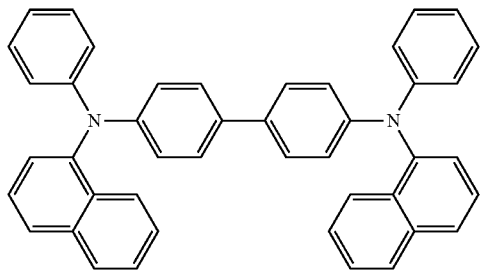

is deposited onto the ITO-coated glass substrate 11 under vacuum of about $10^{-6}$ Torr and at the deposition rate of about 2 Å/sec to form a hole transportation layer 13 having a thickness of about 600 Å. Next, an aluminum complex of tris(8-quinolinolato) (hereinafter, referred to as "Alq") represented by the following formula (VI):

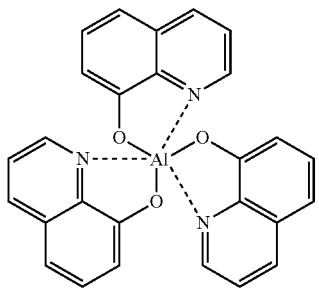

is deposited onto the hole transportation layer 13 under the same vacuum vapor deposition conditions as those applied to the formation of the hole transportation layer 13 to form a light-emissive layer 14 having a thickness of about 400 Å.

Thereafter, bathocuproine (hereinafter, referred to as "BCP") represented by the following formula (VII):

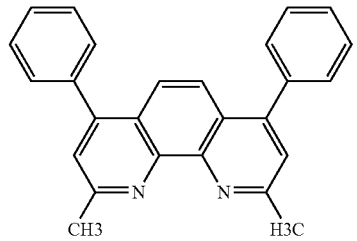 [SMILES: Cc1cc(-c2ccccc2)c2ccc3c(-c4ccccc4)cc(C)nc3c2n1]

and alkaline metal, cesium (Cs), are co-deposited in a molar ratio of BCP:Cs of about 4:1 to form an electron injection layer (metal doping layer/low resistance electron-transporting layer) 15 having a thickness of about 300 Å on the light-emissive layer 14. Note that the inventors of the present invention have disclosed the formation of such an electron injection layer in Japanese Unexamined Patent Publication (Kokai) No. 10-270171. The resulting electron injection layer 15 constitutes an organic structure 18 including a light-emissive layer, in combination with the hole transportation layer 13 and the light-emissive layer 14.

Following the formation of the electron injection layer 15, aluminum (Al) is deposited at the deposition rate of about 10 Å/sec to form a cathode electrode layer (cathode/cathode electrode) 16 having a thickness of about 1,000 Å. The organic EL device having a square light-emissive area of 0.2 cm (length) by 0.2 cm (width) is thus obtained.

Figure 7:
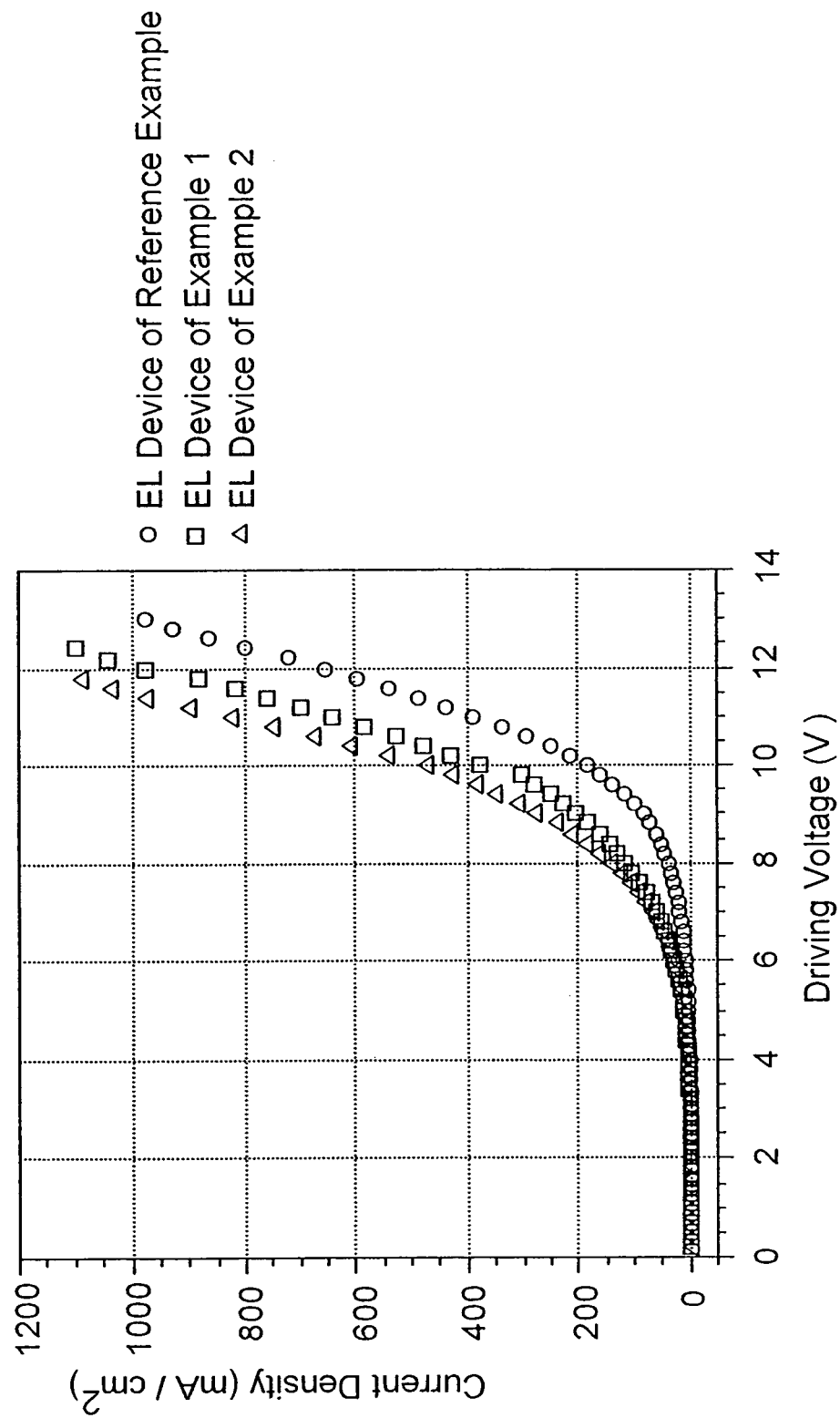
FIG. 7 is a graph showing a characteristic curve of a current density ($mA/cm^2$) to a driving voltage (V) with regard to the organic EL devices according to Reference Example and Examples 1 and 2.
Figure 8:
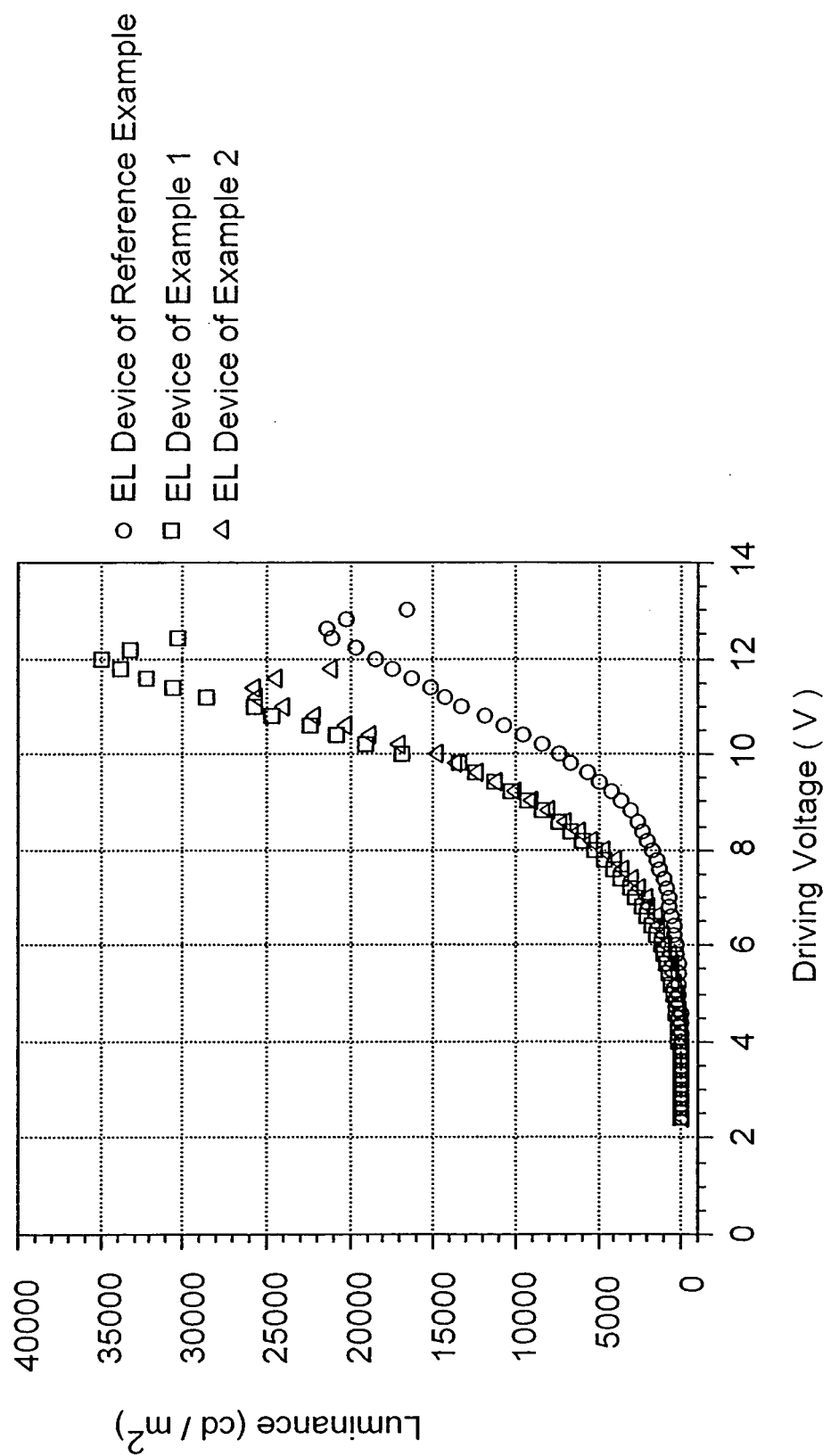
FIG. 8 is a graph showing a characteristic curve of a luminance ($cd/m^2$) to a driving voltage (V) with regard to the organic EL devices according to Reference Example and Examples 1 and 2.
Figure 9:
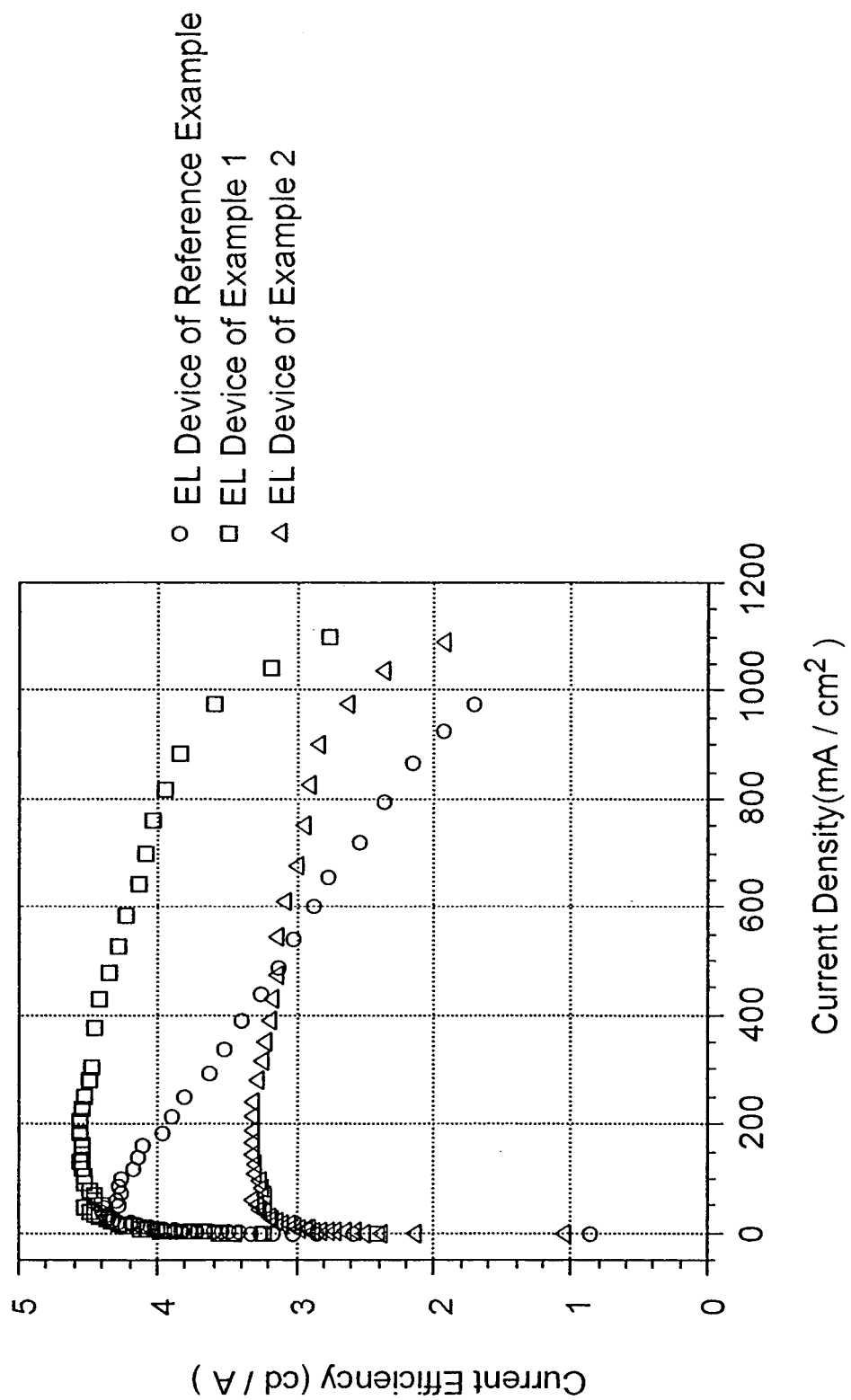
FIG. 9 is a graph showing a characteristic curve of a current efficiency (cd/A) to a current density ($mA/cm^2$) with regard to the organic EL devices according to Reference Example and Examples 1 and 2.
Figure 10:
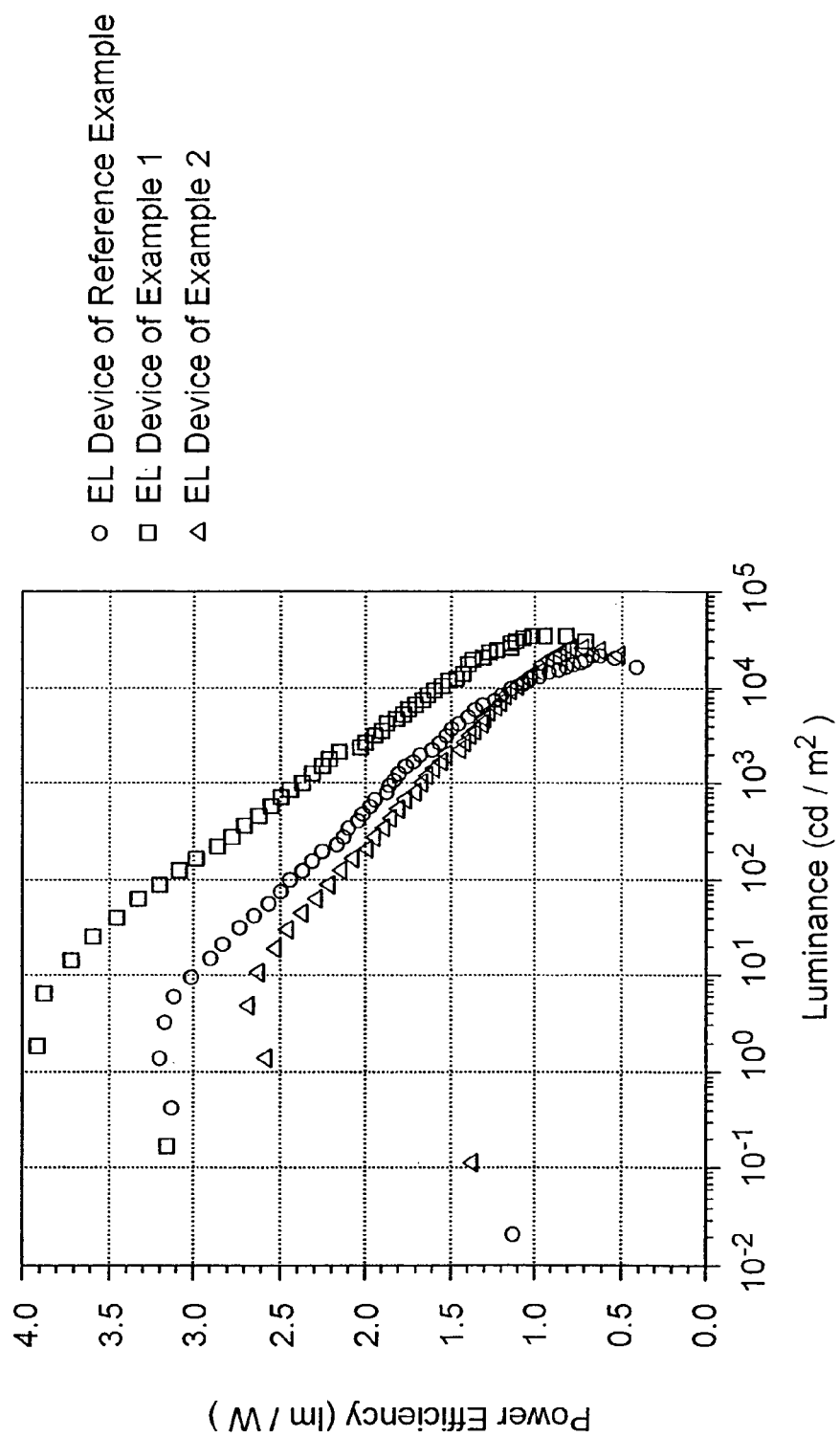
FIG. 10 is a graph showing a characteristic curve of a power efficiency (lm/W) to a luminance ($cd/m^2$) with regard to the organic EL devices according to Reference Example and Examples 1 and 2.
Figure 11:
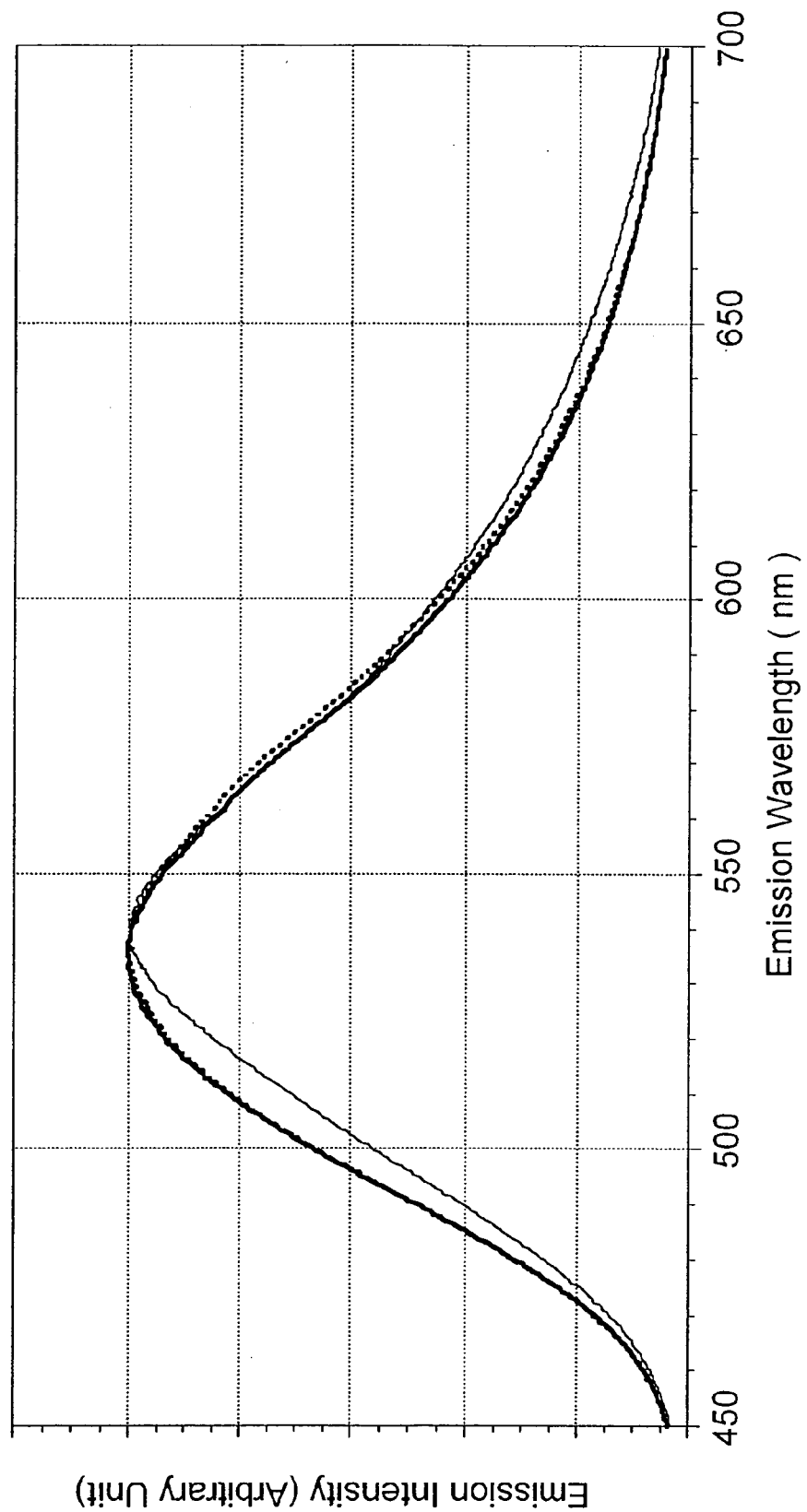
FIG. 11 is a graph showing a light emission spectrum with regard to the organic EL devices according to Reference Example and Examples 1 and 2.

In the organic EL device of this reference example, a DC voltage was applied to between the transparent anode electrode layer (ITO) 12 and the cathode electrode layer (Al) 16, and the luminance of the green light emitted from the light-emissive layer (Alq) 14 was measured. The results were plotted with white circle symbols (○) in FIGS. 7 to 10, in which FIG. 7 represents a graph of current density ($mA/cm^2$)—voltage (V) characteristic curve of the EL device, FIG. 8 represents a graph of luminance ($cd/m^2$)—voltage (V) characteristic curve of the EL device, FIG. 9 represents a graph of current efficiency (cd/A)—current density ($mA/cm^2$) characteristic curve of the EL device and FIG. 10 represents a graph of power efficiency (lm/W)—and luminance ($cd/m^2$) characteristic curve of the EL device. Note that FIGS. 7 to 10 each contains the results obtained in the following examples (Examples 1 and 2) in addition to the results of this reference example. Furthermore, the light emission spectrum of the EL device produced in this reference example was plotted with a thick line in FIG. 11.

Example 1

Figure 5:
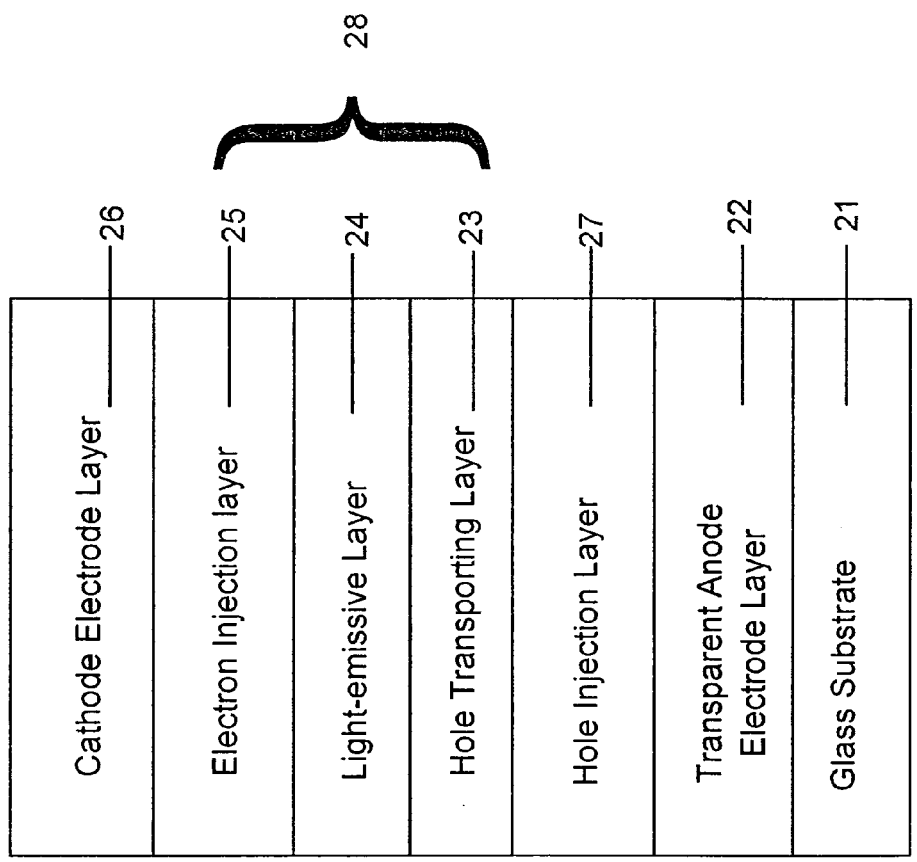
FIG. 5 is a schematic view showing the lamination structure of the organic EL device according to Example 1.

In this example, the organic EL device having the lamination structure of FIG. 5 is fabricated.

A glass substrate 21 is coated thereon with an ITO (indium-tin oxide; Nippon Sheet Glass Co., Ltd.) having a sheet resistance of about 10Ω/□ as a transparent anode electrode layer (anode electrode layer) 22. A metal oxide, $V_2O_5$, and an organic compound having a hole transporting property, α-NPD, are co-deposited at a molar ratio of $V_2O_5$:α-NPD of about 4:1 on the ITO-coated glass substrate 21 to form a mixed layer 27 having a thickness of about 100 Å acting as a hole injection layer.

Thereafter, a hole transportation layer (α-NPD) 23, a light-emissive layer (Alq) 24, an electron injection layer (metal doping layer, low resistance electron transportation layer) 25 and a cathode electrode layer (cathode) 26 are sequentially laminated as in the production of the EL device of the above-described Reference Example. Note that an organic structure 28 including a light-emissive layer is constituted from the hole transportation layer 23, the light-emissive layer 24 and the electron injection layer 25.

In the organic EL device of this example, a DC voltage was applied to between the transparent anode electrode layer (ITO) 22 and the cathode electrode layer (Al) 26, and the luminance of the green light emitted from the light-emissive layer (Alq) 24 was measured. The results were plotted with white square symbols (□) in FIGS. 7 to 10. Furthermore, the light emission spectrum of the EL device produced in this example was plotted with a dotted line in FIG. 11.

Example 2

Figure 6:
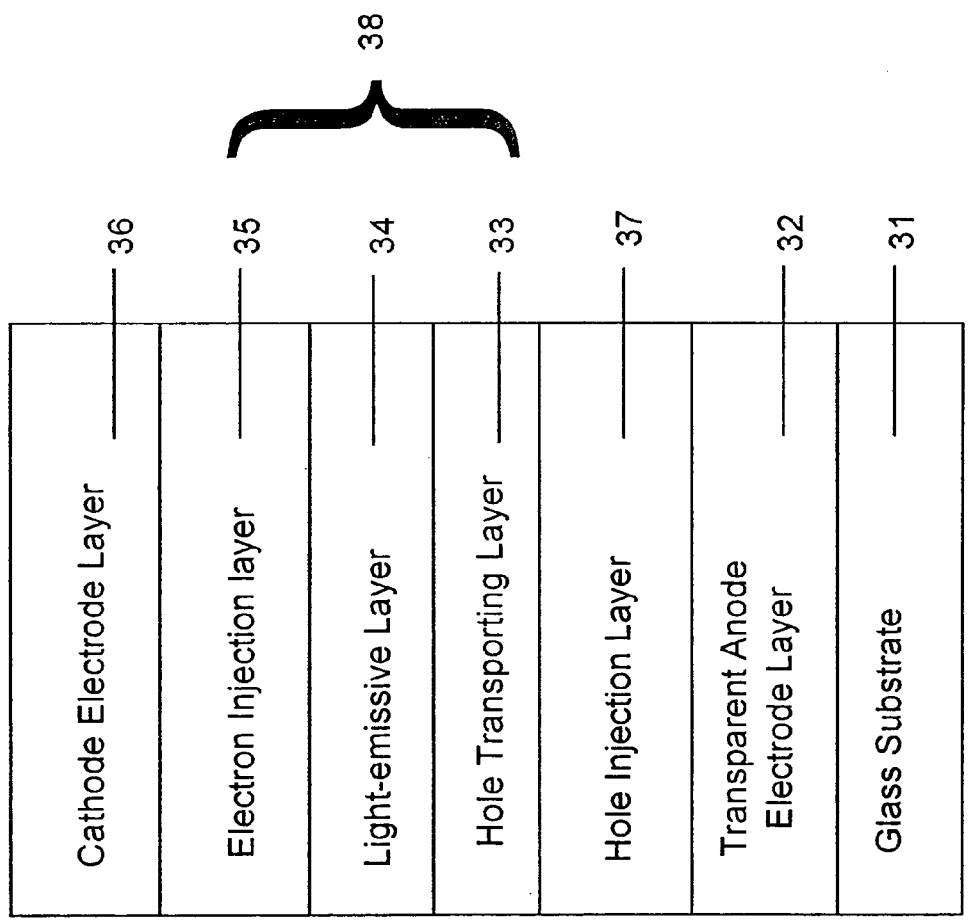
FIG. 6 is a schematic view showing the lamination structure of the organic EL device according to Example 2.

In this example, the organic EL device having the lamination structure of FIG. 6 is fabricated.

A glass substrate 31 is coated thereon with an ITO (indium-tin oxide; Nippon Sheet Glass Co., Ltd.) having a sheet resistance of about 10Ω/□ as a transparent anode electrode layer 32. A metal oxide, $V_2O_5$, and an organic compound having a hole transporting property, α-NPD, are co-deposited at a molar ratio of about 4:1 on the ITO-coated glass substrate 31 to form a mixed layer 37 having a thickness of about 1,000 Å acting as a hole injection layer of the present invention.

Thereafter, a hole transportation layer (α-NPD) 33, a light-emissive layer (Alq) 34, an electron injection layer (metal doping layer) 35 and a cathode electrode layer 36 are sequentially laminated as in the fabrication of the EL device of the above-described Reference Example. Note that an organic structure 38 including a light-emissive layer is formed from the hole transportation layer 33, the light-emissive layer 34 and the electron injection layer 35. In the organic EL device of this example, a DC voltage was applied to between the transparent anode electrode layer (ITO) 32 and the cathode electrode layer (Al) 36, and the luminance of the green light emitted from the light-emissive layer (Alq) 34 was measured. The results were plotted with white triangle symbols (Δ) in FIGS. 7 to 10. Furthermore, the light emission spectrum of the EL device produced in this example was plotted with a thin line in FIG. 11.

Referring to the data plotted in FIGS. 7 to 11, comparison was made between the EL devices produced in the Reference Example and Examples 1 and 2.

(1) The EL devices of Examples 1 and 2 show a lower driving voltage (FIG. 7) and a higher maximum luminance (FIGS. 8 and 10) in comparison with the EL device of Reference Example having no hole injection layer which was incorporated in the EL devices of Examples 1 and 2.

(2) The EL devices of Examples 1 and 2 ensure a high reliability of the EL devices, because as observed in FIG. 9, they do not cause a substantial reduction of the current efficiency (quantum efficiency) at a region of the high current density (region of the current density around 1,000 mA/cm2) in comparison with the EL device of Reference Example.

(3) In the EL devices of Examples 1 and 2, even if a thickness of the hole injection layer is increased as described above, a driving voltage of the EL devices is not increased, and rather the desired current density can be obtained at a lower voltage (FIG. 7) when a thicker layer is applied to the hole injection layer as shown in Example 2.

(4) With regard to the light emission spectrum, it was found that if the hole injection layer having a higher thickness of about 1,000 Å is incorporated in the EL device (Example 2), a peak of the emission spectrum can be shifted to a side of the longer wavelength (FIG. 11) because of the optical interference effect, and thus the hole injection layer of the present invention can be utilized for the control of the color tone. The lower value of the current efficiency in the EL device of Example 2, when compared to the value of the Example 1, can be ascribed to the optical interference effect.

Example 3

Figure 12:
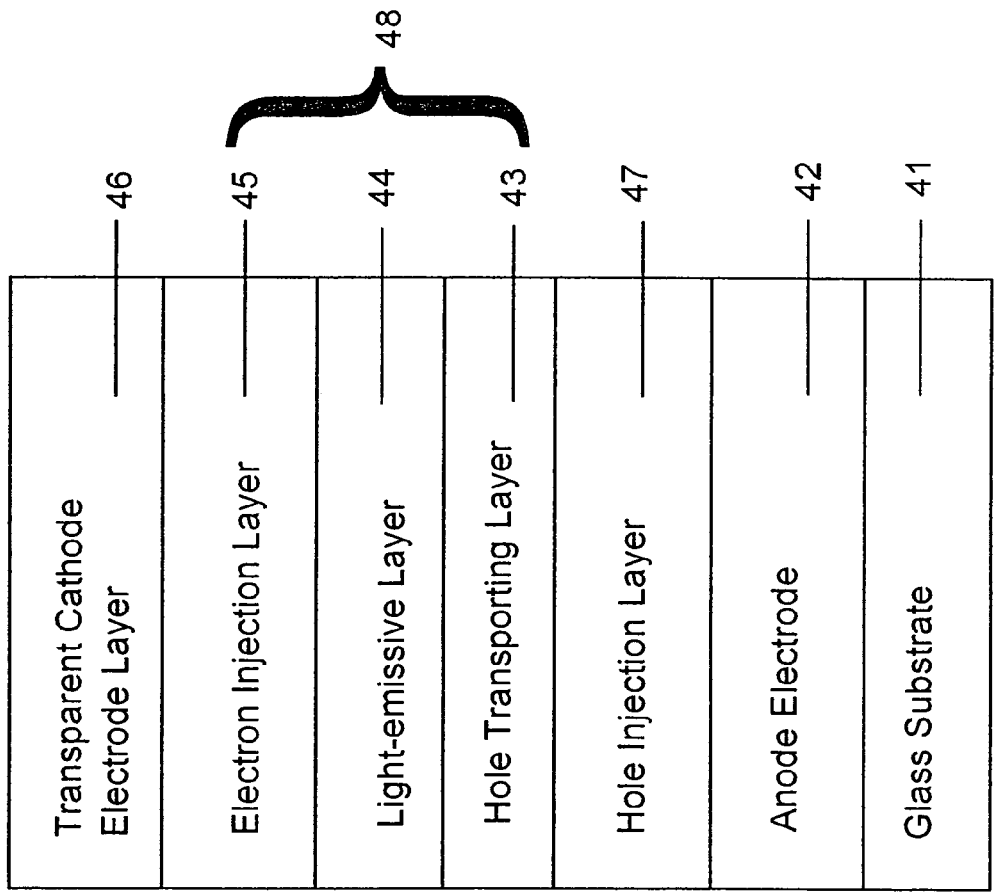
FIG. 12 is a schematic view showing the lamination structure of the organic EL device according to Example 3.

In this example, the organic EL device having the top emission structure of FIG. 12 is fabricated. An aluminum (Al; work function of about 4.2 eV) is deposited at the deposition rate of about 10 Å/sec under the pressure of about $10^{-6}$ Torr (1 Torr=133.32 Pa) (hereinafter, all deposition process is conducted under the same condition) on a glass substrate 41 to form an anode electrode layer 42 having a thickness of about 1,000 Å. A metal oxide, $V_2O_5$, and an organic compound having a hole transporting property, α-NPD, are co-deposited at a molar ratio of about 4:1 on an anode electrode layer 42 to form a mixed layer 47 having a thickness of about 100 Å acting as a hole injection layer of the present invention. Thereafter, α-NPD is deposited at the deposition rate of about 2 Å/sec on the hole injection layer 47 to form a hole transporting layer 43 having a thickness of about 600 Å. Subsequently, Alq is deposited on the hole transportation layer 43 under the same vapor deposition conditions as in the formation of the hole transportation layer 43 to form a light-emissive layer 44 having a thickness of about 600 Å.

Thereafter, to form on the light-emissive layer 44, an electron injection layer 45 which was disclosed by the inventors of the present invention in Japanese Unexamined Patent Publication (Kokai) No. 11-233262, (8-quinolinato) lithium complex (hereinafter, briefly referred to as "Liq") represented by the following formula (VIII):

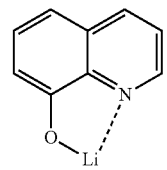

is deposited at a thickness of about 10 Å, followed by depositing aluminum (Al) at the thickness of about 15 Å to form an electron injection layer 15 by generating the thermal reduction reaction. Note that an organic structure 48 including a light-emissive layer is formed from the hole transportation layer 43, the light-emissive layer 44 and the electron injection layer 45. Thereafter, ITO is deposited at the deposition rate of about 4 Å/sec by using the sputtering method disclosed by the inventors of the present invention in Japanese Unexamined Patent Publication (Kokai) No. 2001-142627 to form a transparent cathode electrode layer 46 having a thickness of about 1,000 Å. The EL device thus obtained has the square light-emissive area of 0.2 cm (length) by 0.2 cm (width).

Figure 13:
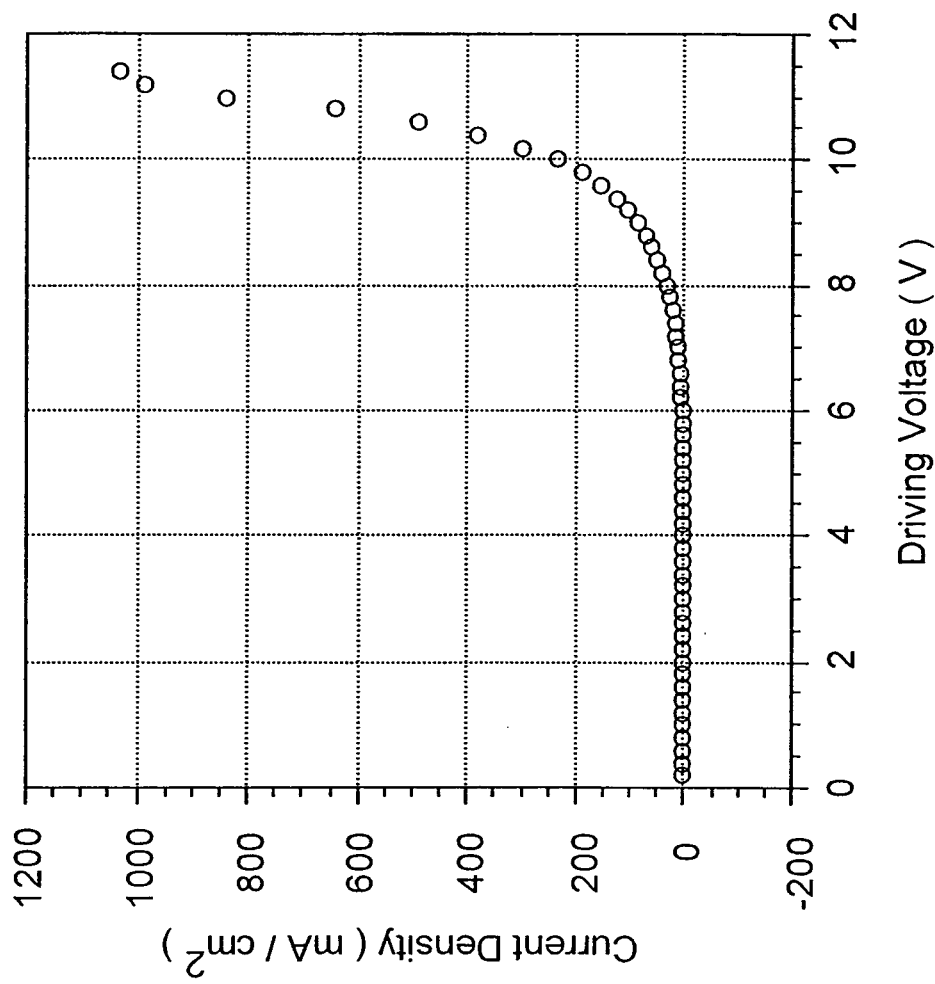
FIG. 13 is a graph showing a characteristic curve of a current density ($mA/cm^2$) to a driving voltage (V) with regard to the organic EL device according to Example 3.
Figure 14:
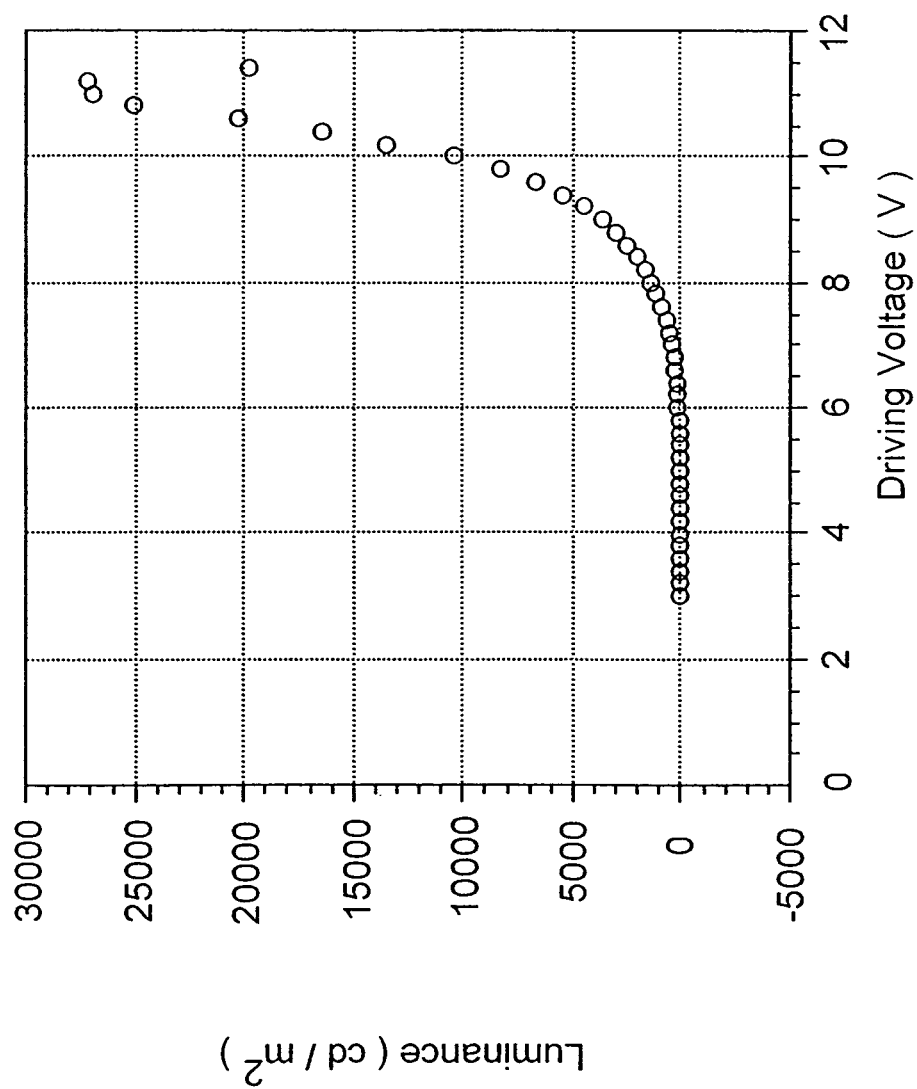
FIG. 14 is a graph showing a characteristic curve of a luminance ($cd/m^2$) to a driving voltage (V) with regard to the organic EL device according to Example 3.
Figure 15:
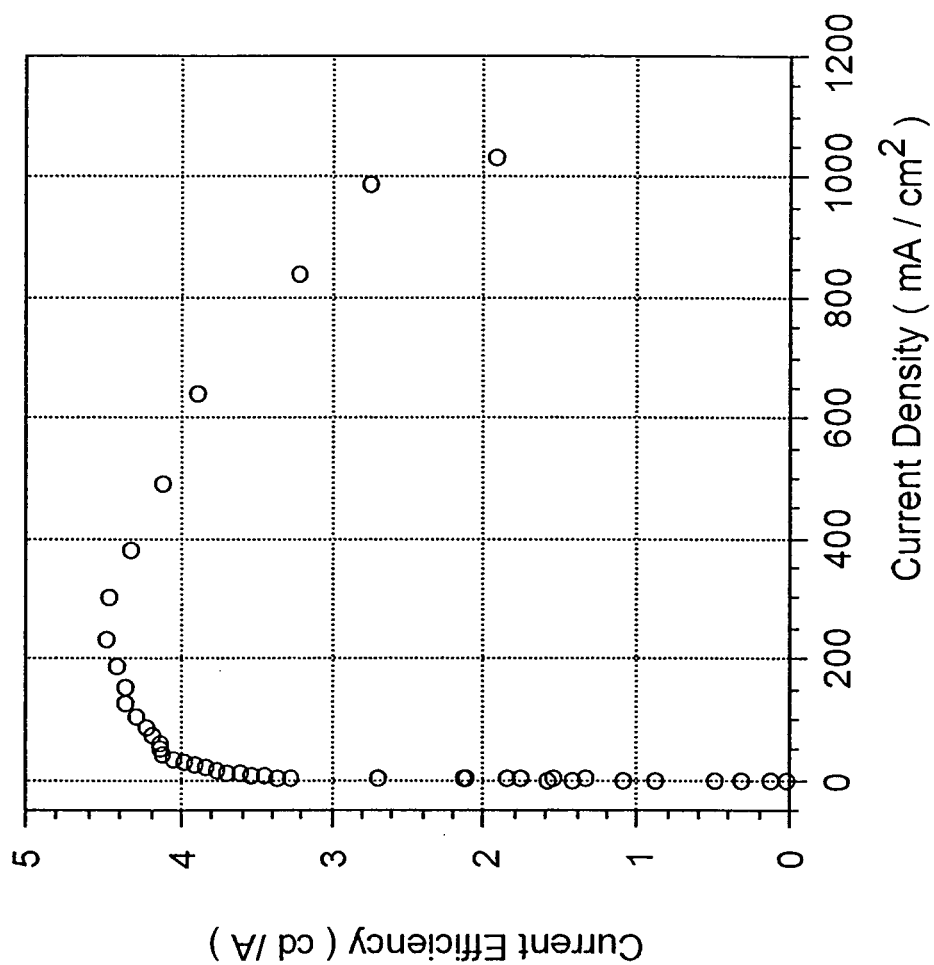
FIG. 15 is a graph showing a characteristic curve of a current efficiency (cd/A) to a current density ($mA/cm^2$) with regard to the organic EL device according to Example 3.
Figure 16:
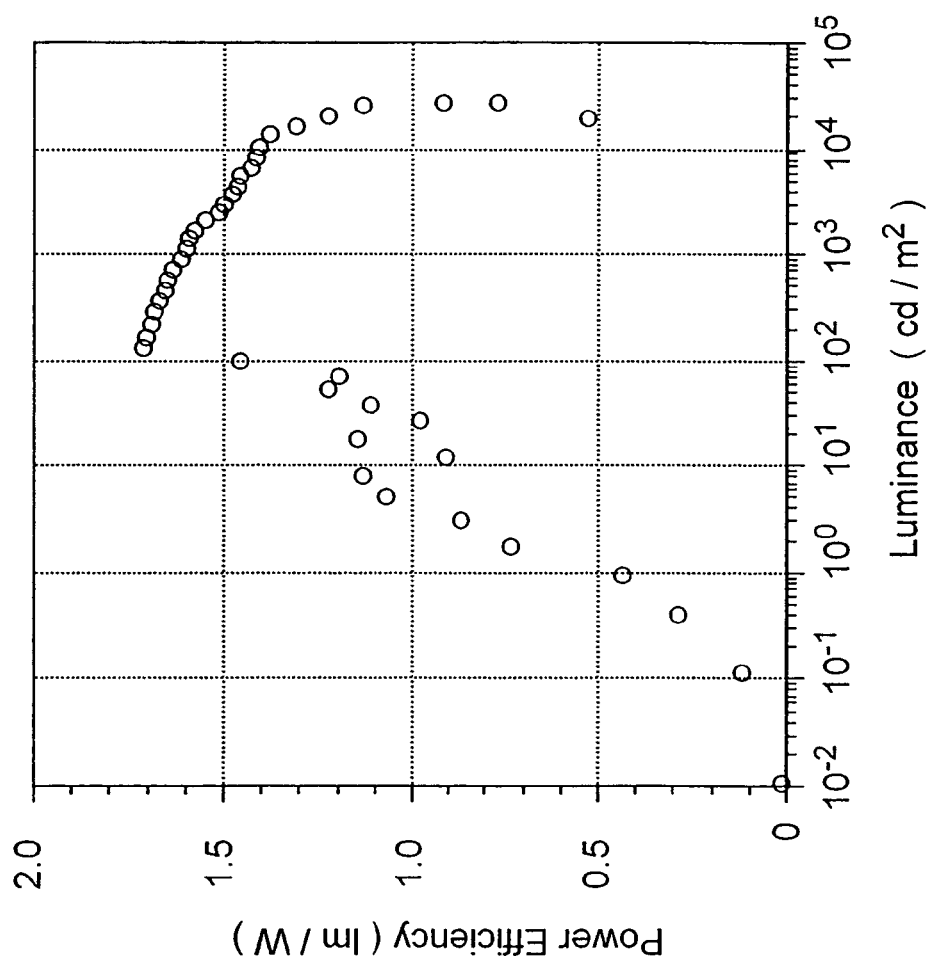
FIG. 16 is a graph showing a characteristic curve of a power efficiency (lm/W) to a luminance ($cd/m^2$) with regard to the organic EL device according to Example 3.
Figure 17:
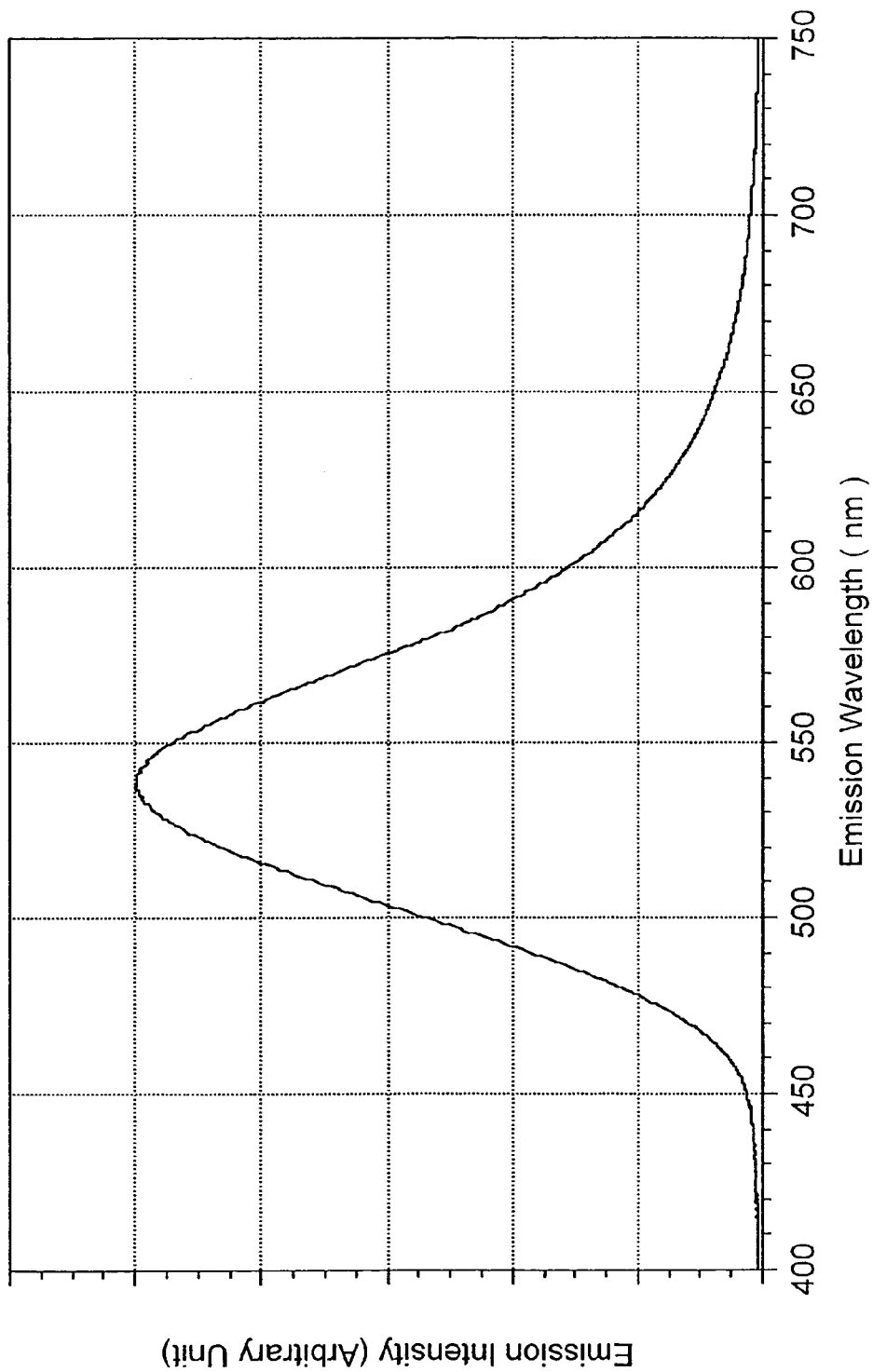
FIG. 17 is a graph showing a light emission spectrum with regard to the organic EL device according to Example 3.

In the organic EL device of this example, a DC voltage was applied to between the anode electrode layer (Al) 42 and the transparent cathode electrode layer (ITO) 46, and the luminance of the green light emitted from the light-emissive layer (Alq) 44 was measured. The results were plotted in FIGS. 13 to 16 in which FIG. 13 represents a graph of current density ($mA/cm^2$)—voltage (V) characteristic curve of the EL device, FIG. 14 represents a graph of luminance ($cd/m^2$)—voltage (V) characteristic curve of the EL device, FIG. 15 represents a graph of current efficiency (cd/A)—current density (mA/cm$^2$) characteristic curve of the EL device and FIG. 16 represents a graph of power efficiency (lm/W)—and luminance (cd/m$^2$) characteristic curve of the EL device. Furthermore, the light emission spectrum of the EL device produced in this example was plotted in FIG. 17.

As shown in FIG. 14, the maximum luminance observed in the EL device of this example was above about 25,000 cd/m$^2$, and also its current efficiency was comparable to the results observed in the EL devices of Reference Example and Example 1 (FIGS. 15 and 16). Accordingly, it was found that the hole injection layer of the present invention can effectively act as such a layer, even if the anode electrode layer is formed from a lower work function metal such as Al (4.2 eV) compared to ITO (5.0 eV).

Example 4

Figure 18:
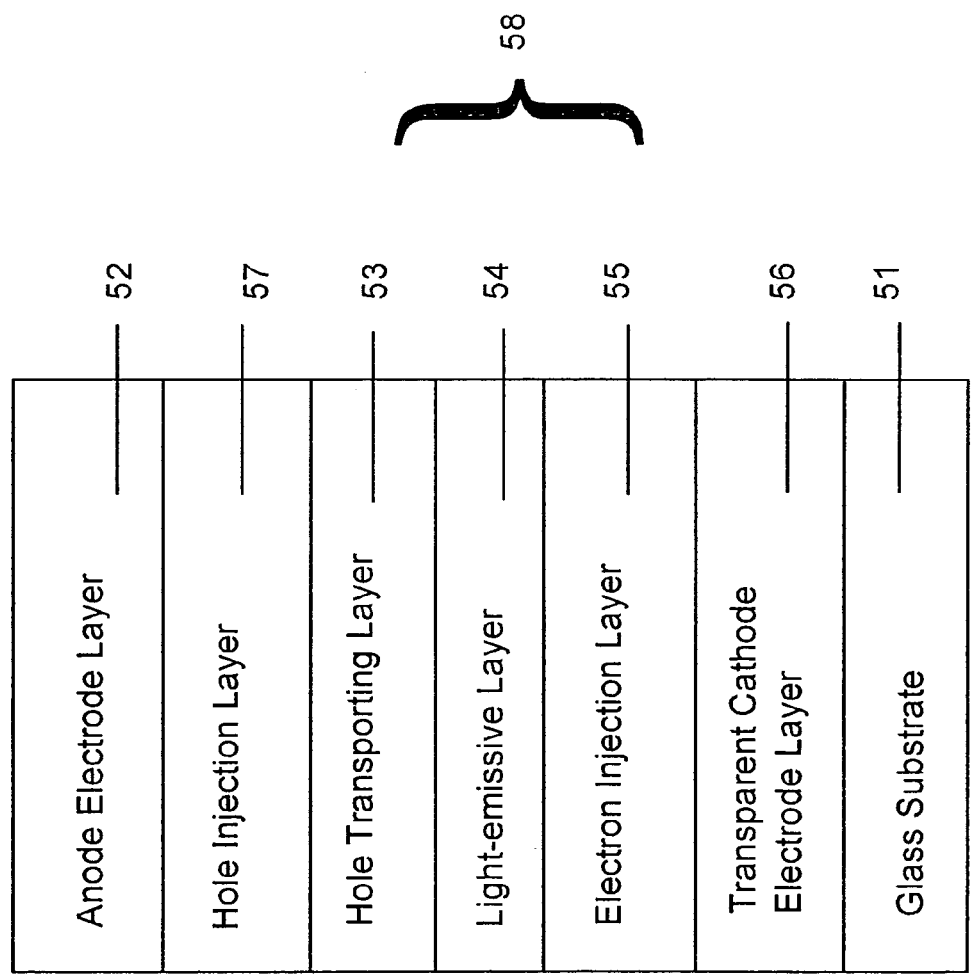
FIG. 18 is a schematic view showing the lamination structure of the organic EL device according to Example 4.

In this example, the organic EL device having the lamination structure of FIG. 18 is produced. Note that the EL device produced in this example has the layer structure which is in reverse to that of the conventional organic EL devices, i.e., a transparent cathode electrode layer, an organic structure including a light-emissive layer, a hole injection layer and an anode electrode layer are laminated in this order on a substrate. A glass substrate 51 has coated thereon an ITO (indium-tin oxide; Nippon Sheet Glass Co., Ltd.) having a sheet resistance of about 10Ω/□ as a transparent cathode electrode layer 56. Thereafter, BCP and Cs are co-deposited at molar ratio of about 4:1 on the ITO-coated glass substrate 51 to form a mixed layer having a thickness of about 100 Å as an electron injection layer (metal doping layer) 55.

Thereafter, Alq is vapor deposited on the electron injection layer 55 to form a light-emissive layer 54 having a thickness of about 600 Å. After formation of the light-emissive layer 54, α-NPD is deposited on the layer 54 to form a hole transporting layer 53 having a thickness of about 600 Å. Thereafter, a metal oxide, V$_2$O$_5$, and an organic compound having a hole transporting property, α-NPD, are co-deposited at a molar ratio of about 4:1 on the hole transporting layer 53 to form a hole injection layer 57 having a thickness of about 100 Å. Subsequently, aluminum (Al) is deposited at the deposition rate of about 10 Å/sec to form an anode electrode layer 52 having a thickness of about 1,000 Å (1 Å=1×10$^{-10}$ m). The EL device thus obtained has the square light-emissive area of 0.2 cm (length) by 0.2 cm (width). Note that in the EL device an organic structure 58 including a light-emissive layer is formed from the hole transporting layer 53, the light-emissive layer 54 and the electron injection layer 55.

Figure 19:
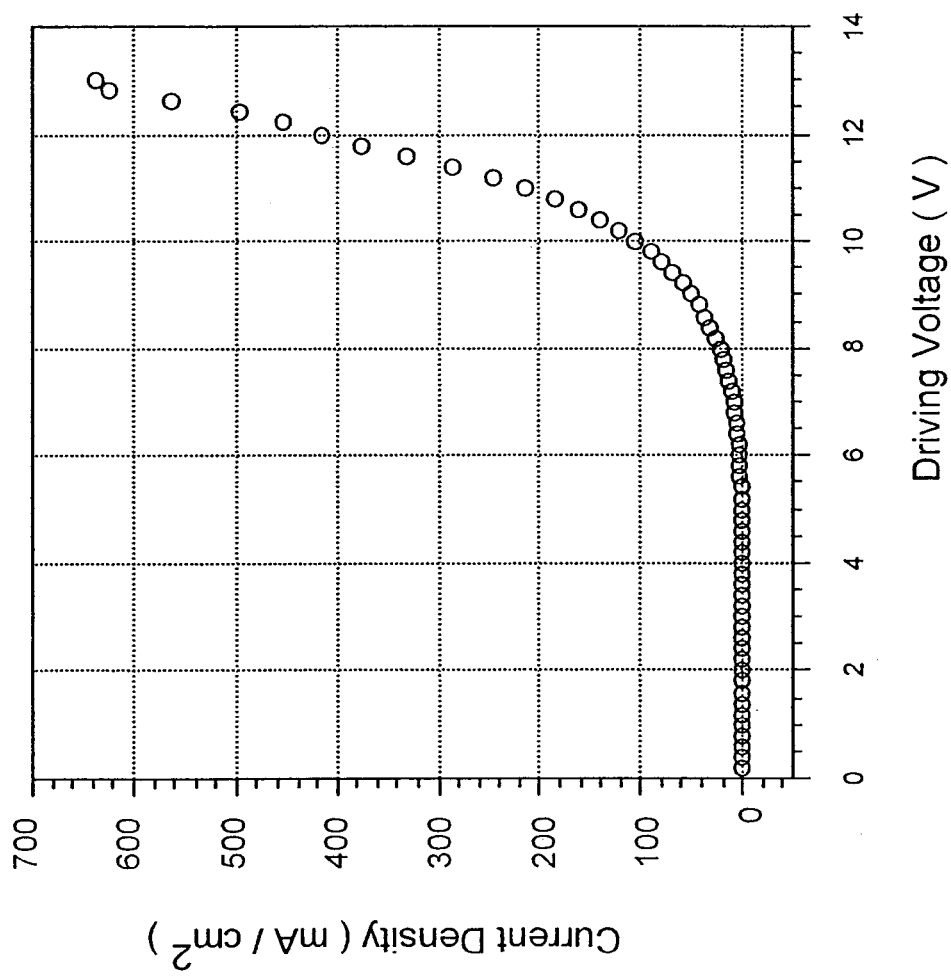
FIG. 19 is a graph showing a characteristic curve of a current density ($mA/cm^2$) to a driving voltage (V) with regard to the organic EL device according to Example 4.
Figure 20:
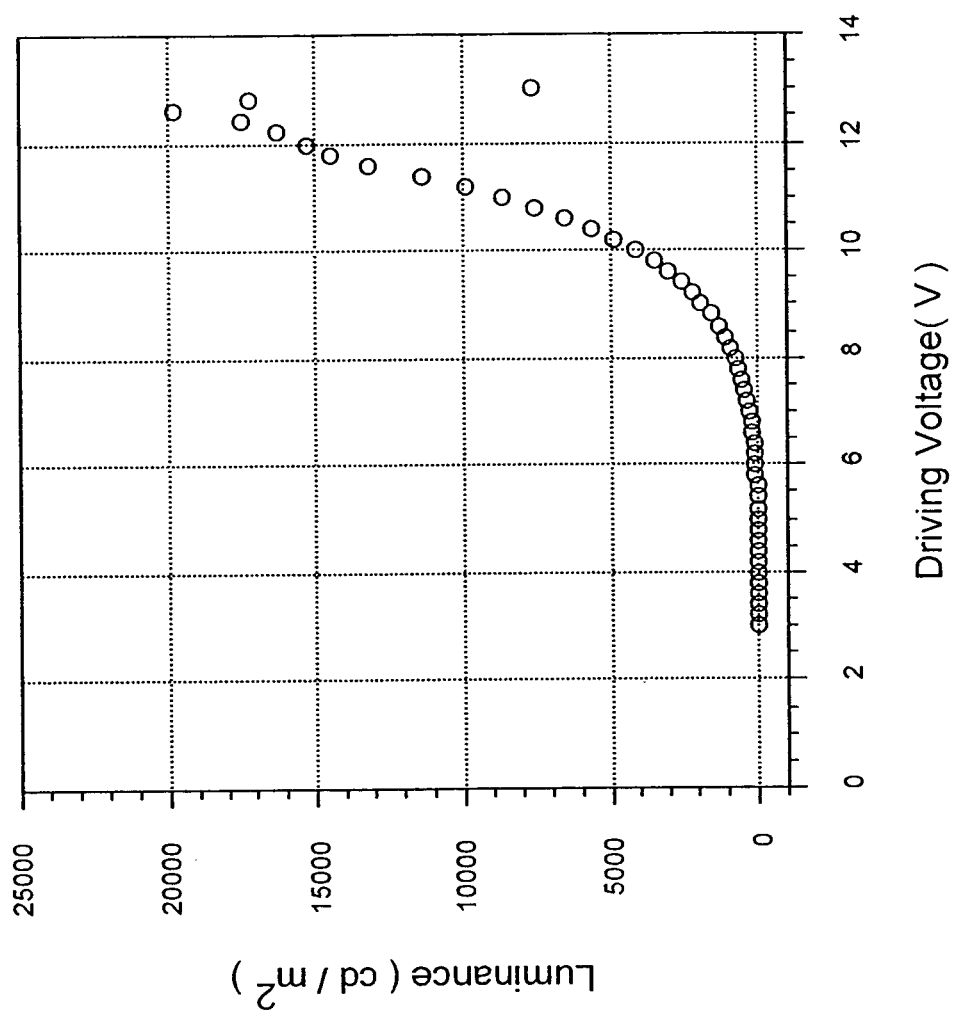
FIG. 20 is a graph showing a characteristic curve of a luminance ($cd/m^2$) to a driving voltage (V) with regard to the organic EL device according to Example 4.
Figure 21:
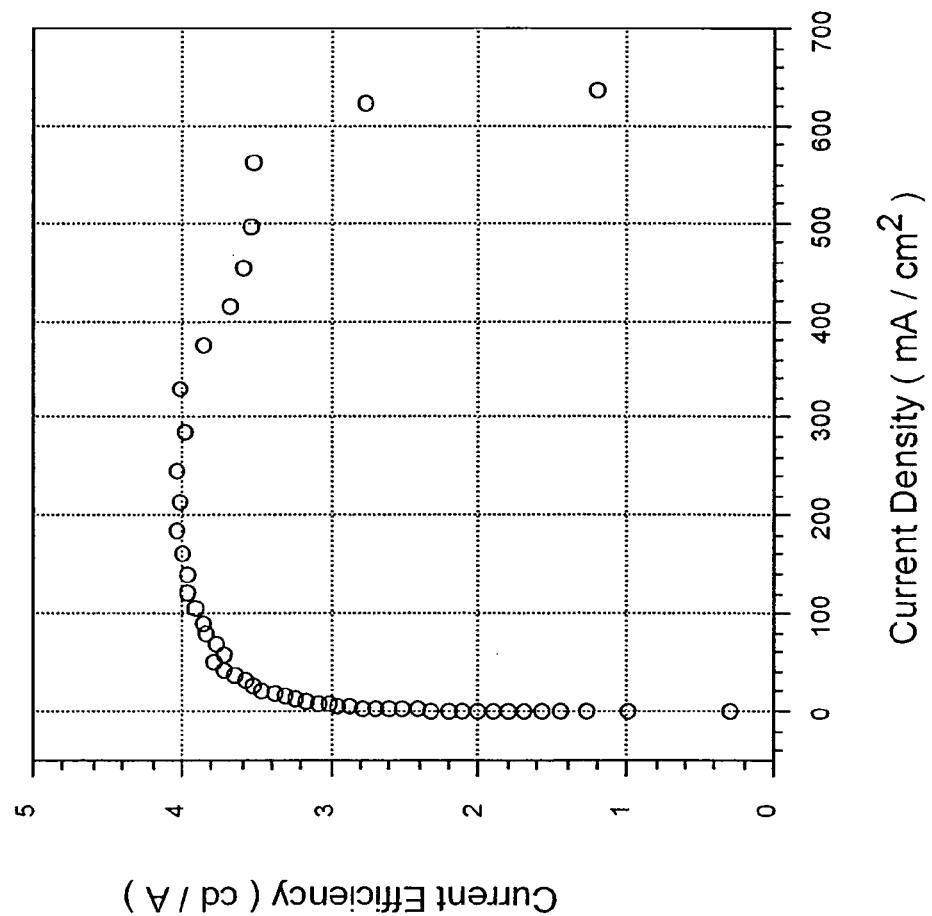
FIG. 21 is a graph showing a characteristic curve of a current efficiency (cd/A) to a current density ($mA/cm^2$) with regard to the organic EL device according to Example 4.
Figure 22:
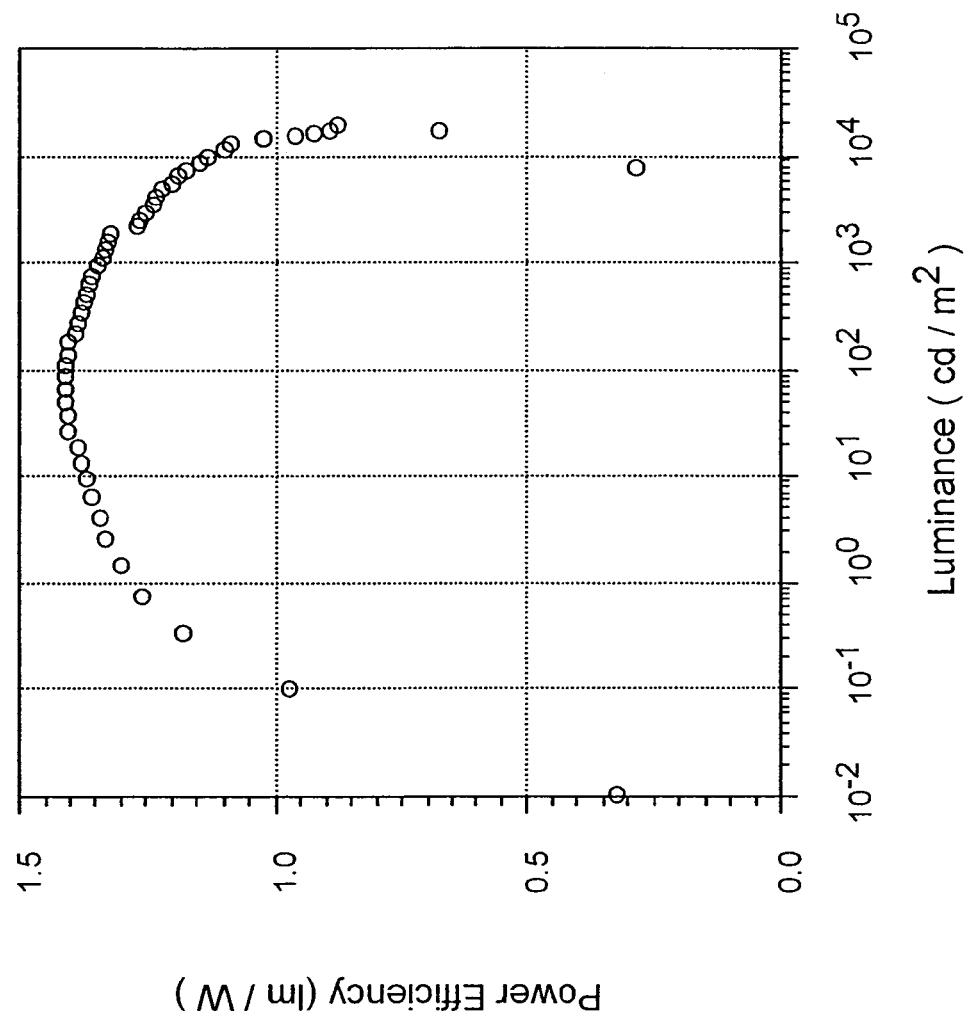
FIG. 22 is a graph showing a characteristic curve of a power efficiency (lm/W) to a luminance ($cd/m^2$) with regard to the organic EL device according to Example 4.
Figure 23:
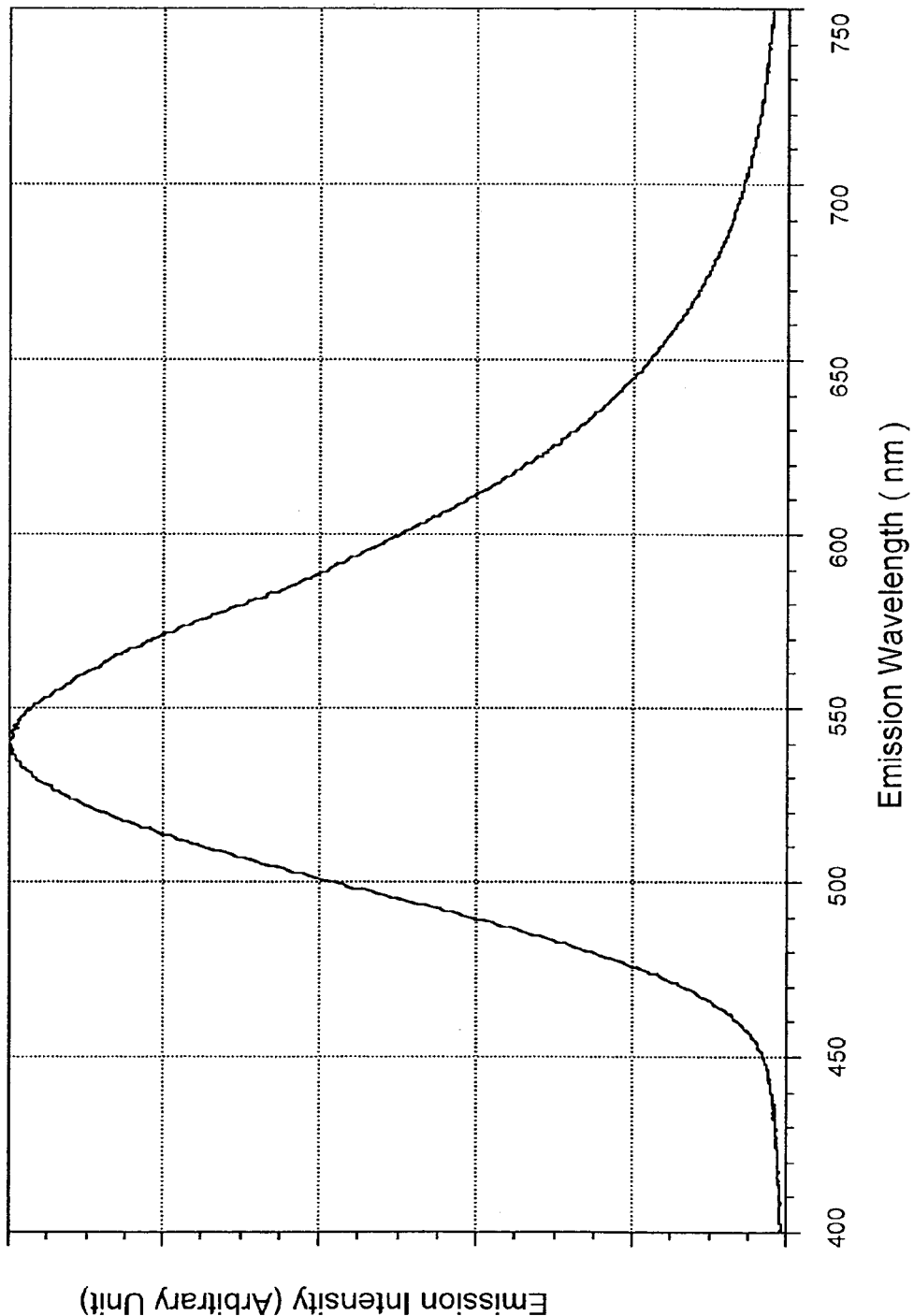
FIG. 23 is a graph showing a light emission spectrum with regard to the organic EL device according to Example 4.

In the organic EL device of this example, a DC voltage was applied to between the transparent cathode electrode layer (ITO) 56 and the anode electrode layer (Al) 52, and the luminance of the green light emitted from the light-emissive layer (Alq) 54 was measured. The results were plotted in FIGS. 19 to 22 in which FIG. 19 represents a graph of current density (mA/cm$^2$)—voltage (V) characteristic curve of the EL device, FIG. 20 represents a graph of luminance (cd/m$^2$)—voltage (V) characteristic curve of the EL device, FIG. 21 represents a graph of current efficiency (cd/A)—current density (mA/cM$^2$) characteristic curve of the EL device and FIG. 22 represents a graph of power efficiency (lm/W)—and luminance (cd/m$^2$) characteristic curve of the EL device. Furthermore, the light emission spectrum of the EL device produced in this example was plotted in FIG. 23.

As shown in FIG. 20, in the EL device of this example, the maximum luminance amounted to about 20,000 cd/m$^2$, and also its current efficiency was almost comparable to the results observed in the EL devices of Reference Example and Example 1 (FIGS. 21 and 22). Accordingly, it was found that the organic EL device of this example can effectively act as such a device, even if the layers constituting the EL device are laminated in the reverse order to the conventional EL devices, an hole injection layer is formed before the final formation of the anode electrode layer, and a relatively low work function metal such as Al is used in the formation of the anode electrode layer.

Example 5

Figure 24:
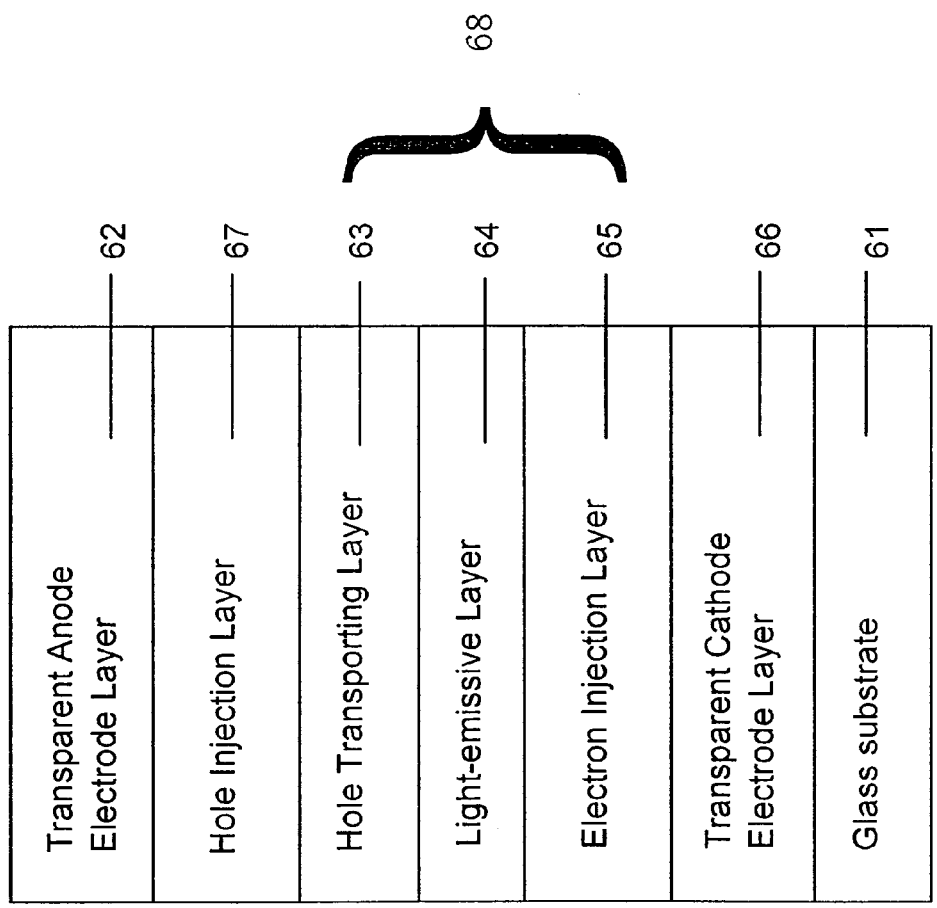
FIG. 24 is a schematic view showing the lamination structure of the organic EL device according to Example 5.

In this example, the organic EL device having the lamination structure of FIG. 24 is produced. Note that the EL device produced in this example has the layer structure which is in reverse to that of the conventional organic EL devices, i.e., a transparent cathode electrode layer, an organic structure including a light-emissive layer, a hole injection layer and a transparent anode electrode layer are laminated in this order on a substrate. A glass substrate 61 has coated thereon an ITO (indium-tin oxide; Nippon Sheet Glass Co., Ltd.) having a sheet resistance of about 10Ω/□ as a transparent cathode electrode layer 66. Then, BCP and Cs are co-deposited at molar ratio of about 4:1 on the ITO-coated glass substrate 61 to form a mixed layer having a thickness of about 100 Å as an electron injection layer 65.

Thereafter, Alq is vapor deposited on the electron injection layer 65 to form a light-emissive layer 64 having a thickness of about 600 Å. After formation of the light-emissive layer 64, α-NPD is deposited on the layer 64 to form a hole transporting layer 63 having a thickness of about 600 Å. Thereafter, a metal oxide, V$_2$O$_5$, and an organic compound having a hole transporting property, α-NPD, are co-deposited at a molar ratio of about 4:1 on the hole transporting layer 63 to form a hole injection layer 57 having a thickness of about 100 Å. Note that an organic structure 68 including a light-emissive layer is constituted from the hole transporting layer 63, the light-emissive layer 64 and the electron injection layer 65. Then, ITO is deposited at the deposition rate of about 4 Å/sec by using the sputtering method to form a transparent anode electrode layer (anode layer) 62 having a thickness of about 1,000 Å. The EL device thus obtained has the square light-emissive area of 0.2 cm (length) by 0.2 cm (width).

Figure 25:
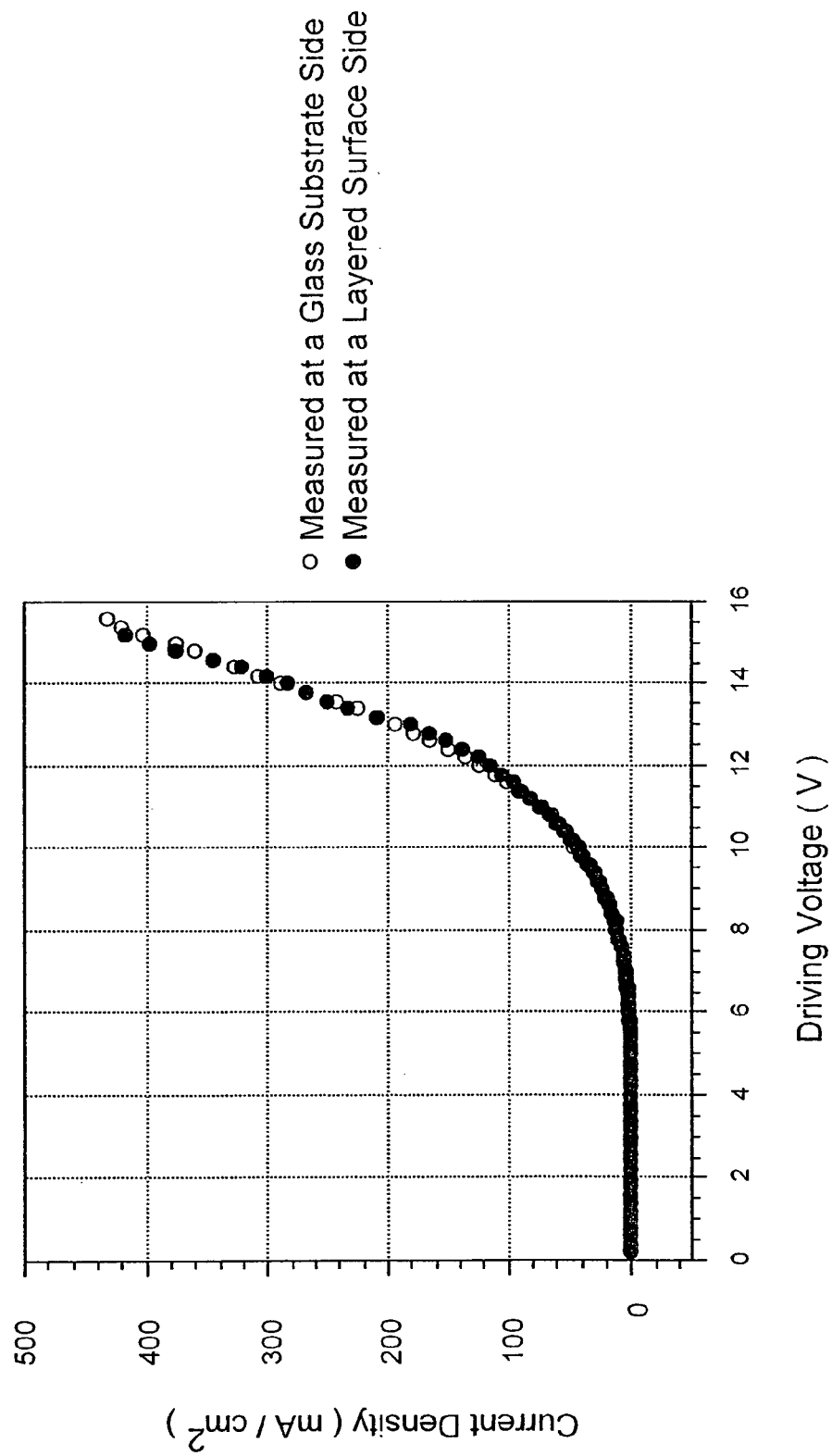
FIG. 25 is a graph showing a characteristic curve of a current density ($mA/cm^2$) to a driving voltage (V) with regard to the organic EL device according to Example 5.
Figure 26:
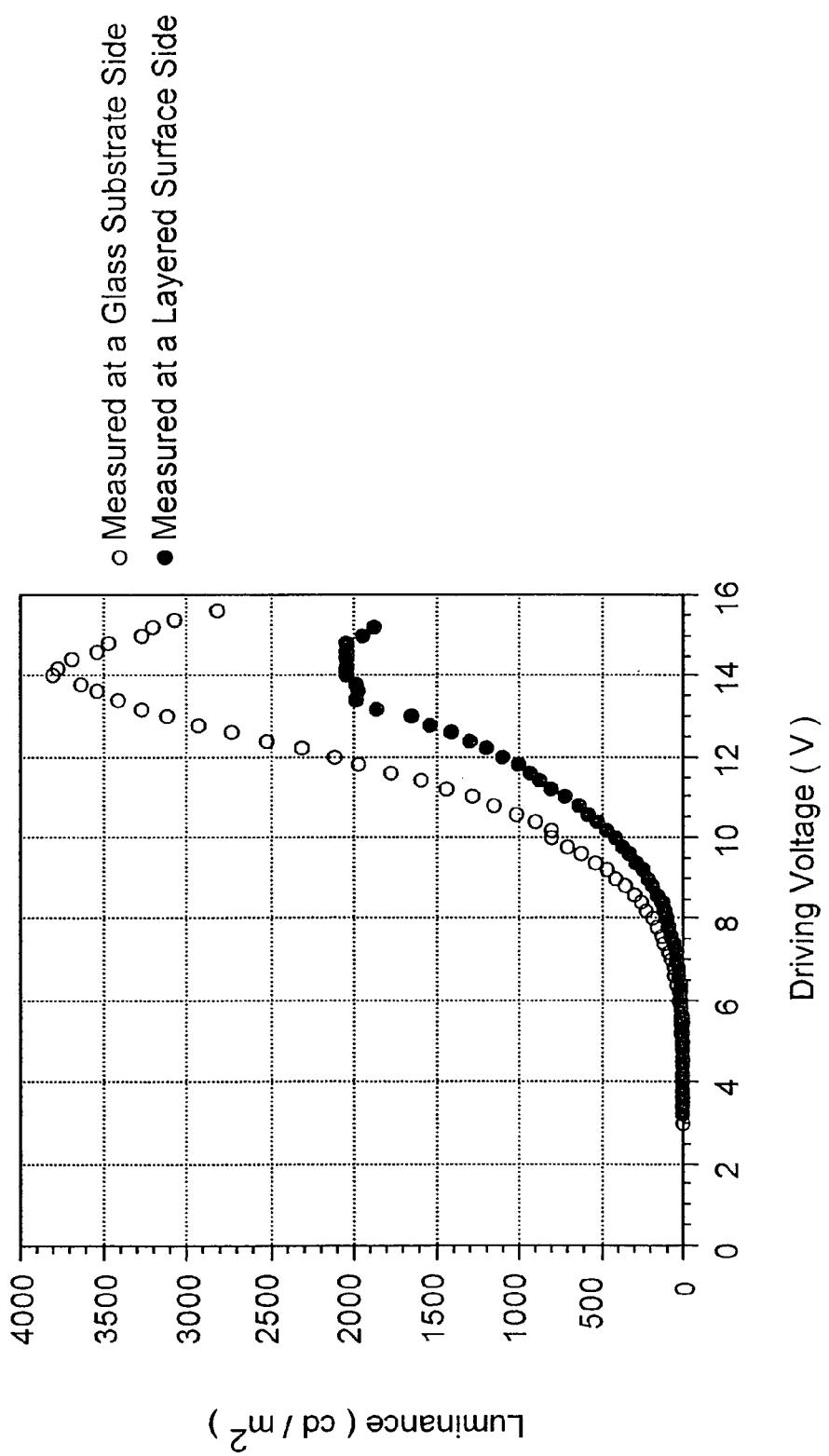
FIG. 26 is a graph showing a characteristic curve of a luminance ($cd/m^2$) to a driving voltage (V) with regard to the organic EL device according to Example 5.
Figure 27:
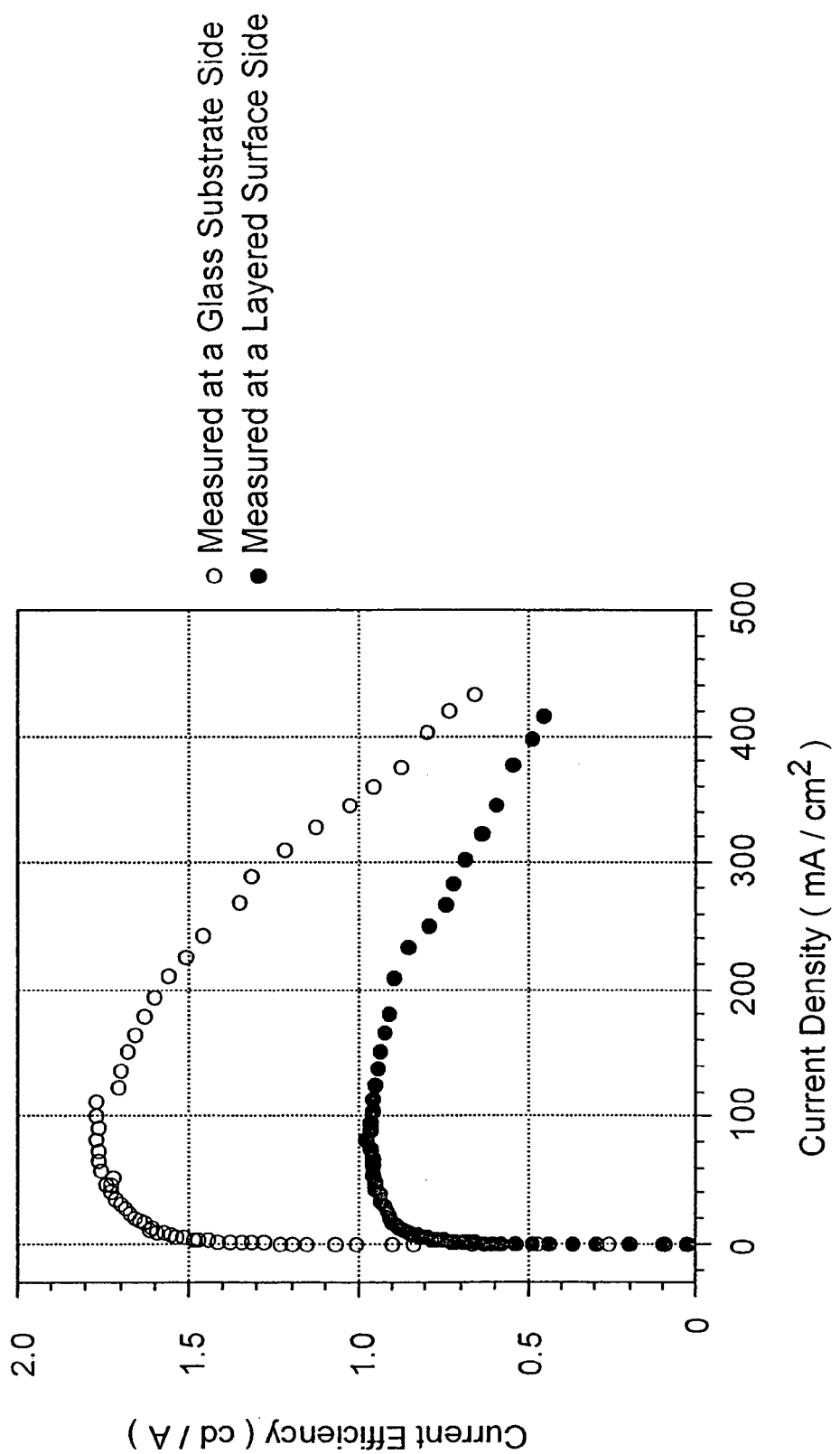
FIG. 27 is a graph showing a characteristic curve of a current efficiency (cd/A) to a current density ($mA/cm^2$) with regard to the organic EL device according to Example 5.
Figure 28:
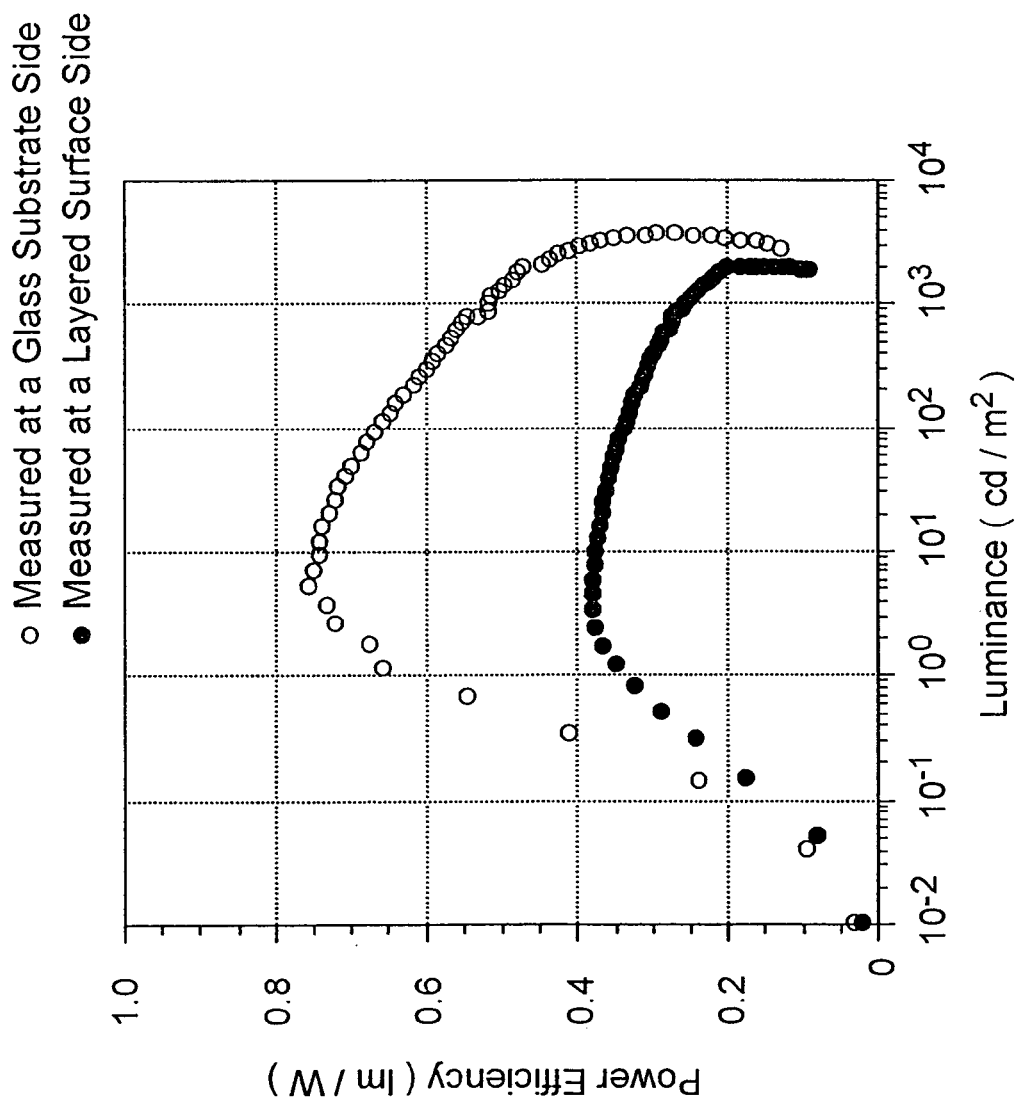
FIG. 28 is a graph showing a characteristic curve of a power efficiency (lm/W) to a luminance ($cd/m^2$) with regard to the organic EL device according to Example 5.

In the organic EL device of this example, a DC voltage was applied to between the transparent cathode electrode layer (ITO) 66 and the transparent anode electrode layer (ITO) 62, and the luminance of the green light emitted from the light-emissive layer (Alq) 64 was measured. The results were plotted in FIGS. 25 to 28 in which FIG. 25 represents a graph of current density (mA/cm$^2$)—voltage (V) characteristic curve of the EL device, FIG. 26 represents a graph of luminance (cd/m$^2$)—voltage M characteristic curve of the EL device, FIG. 27 represents a graph of current efficiency (cd/A)—current density (mA/cm$^2$) characteristic curve of the EL device and FIG. 28 represents a graph of power efficiency (lm/W)—and luminance (cd/m$^2$) characteristic curve of the EL device. In these drawings, the results measured at a side of the glass substrate (substrate) of the EL device were plotted with white circle symbols (○), and the results measured at a side of the layered surface of the EL device were plotted with black circle symbols (●). Furthermore, in FIG. 29, the emission spectrums measured at a side of the glass substrate (substrate) of the EL device were indicated with a solid line, and the emission spectrums measured at a side of the layered surface of the EL device were indicated with a dotted line.

Figure 29:
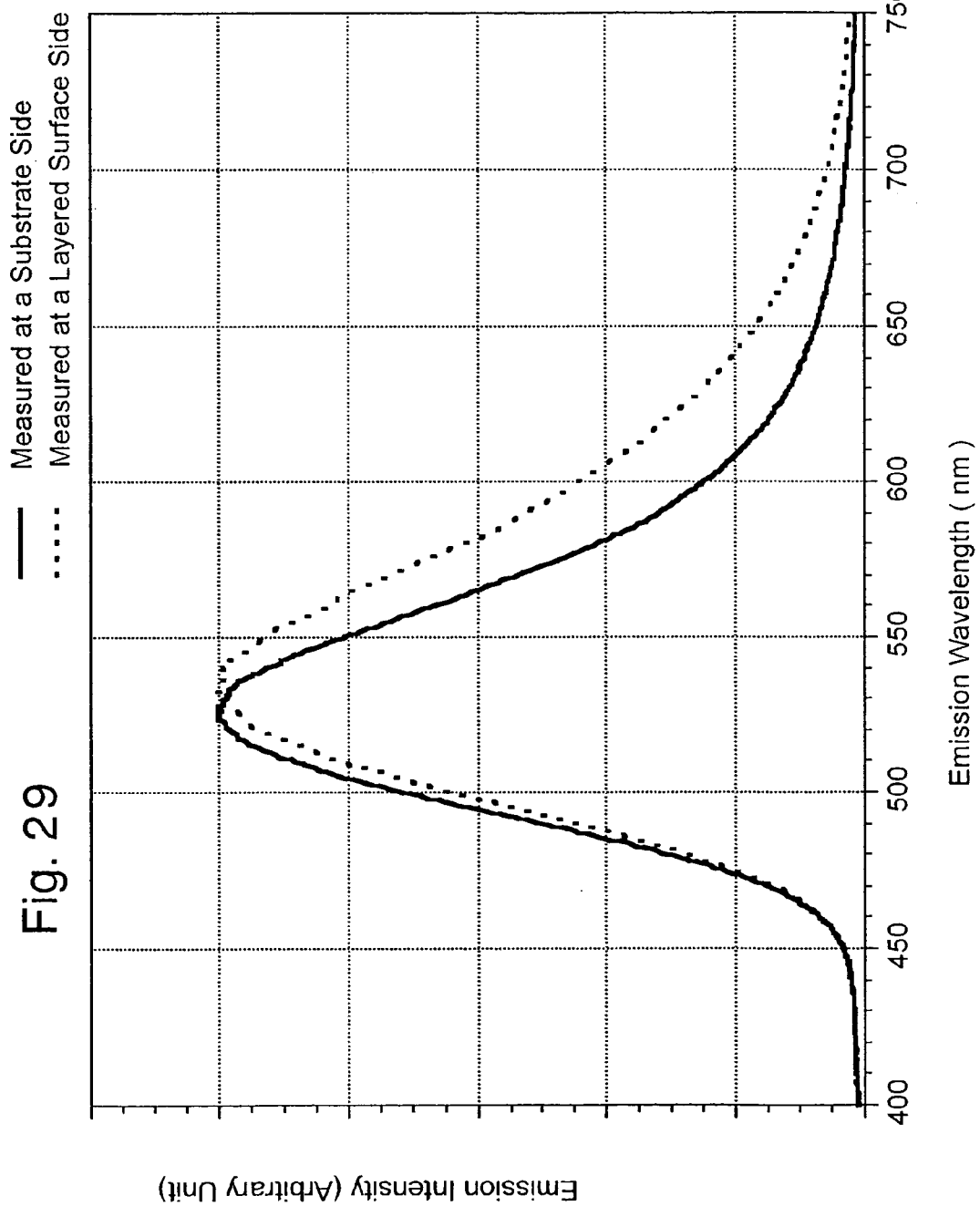
FIG. 29 is a graph showing a light emission spectrum with regard to the organic EL device according to Example 5.

The organic EL device produced in this example is a transparent light-emissive device in which the light emission can be observed on both of the glass substrate side and the layered surface side (side of the transparent anode electrode layer) of the EL device. However, as shown in FIG. 29, the emission spectrums of the light emitted from these sides of the EL device are different from each other because of the optical interference effect described above.

In addition, in the EL device of this example, the layers constituting the EL device are laminated in the reverse order to the conventional EL devices, and a hole injection layer is formed before the final formation of the anode electrode layer. Accordingly, an organic structure 68 including a light-emissive layer is protected with the hole injection layer 67 from the high energy particles induced process such as the ITO-sputtering process used in the formation of the transparent anode electrode layer 62, and thus any damage caused in the organic structure 68 due to such process can be reduced. Therefore, it was found that the hole injection layer 67 can effectively act as a damage-diminishing layer.

In the organic EL device according to the invention, the EL device may have the layer structure that two or more light-emissive units (a layered portion sandwiched between the cathode electrode layer and the anode electrode layer; when the EL device includes a layer structure of, for example, "(anode)/hole injection layer/hole transportation layer/light-emissive layer/electron injection layer/(cathode)", the "hole injection layer/hole transportation layer/light-emissive layer/electron injection layer" corresponds to the "light-emissive unit") are partitioned with a charge-generation layer. In this layer structure, the charge-generation layer can act as a hole-generating layer and an electron-generating layer during application of voltage, and as a result, the light-emissive units can simultaneously emit light as in operation of two or more organic EL devices connected in series. Namely, the charge-generation layer can act as a hole injection layer with regard to the light-emissive unit adjacent and disposed on a cathode electrode layer side thereof, and also it can act as an electron injection layer with regard to the light-emissive unit adjacent and disposed on an anode electrode layer side thereof.

Test Example

In this test example, the resistivity (Ωcm) of the hole injection layer according to the present invention is measured for the reference. The measurement is carried out with two different methods depending on the values (range) of the resistivity of the test samples.

Figure 30:
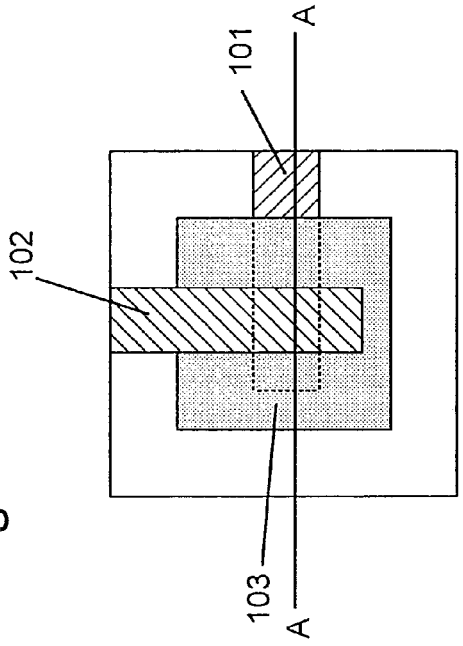
FIG. 30 is a plan view showing a device having a sandwiched structure used in the evaluation of the resistivity.
Figure 31:
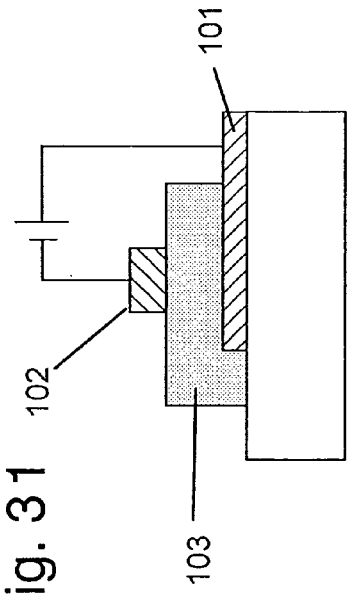
FIG. 31 is a cross-sectional view taken along line A-A of the EL device of FIG. 30.

The first measuring method (sandwich method) is a method suitable for the test samples having a relatively large resistivity, and the measurement process is carried out by sandwiching a vapor deposition layer of the test sample with electrodes (the resistivity evaluation device having a sandwich structure shown in FIGS. 30 and 31). Using this method, the resistivity of the test sample is calculated from a ratio of the electric field E (V/cm), obtained from an applied voltage (V) and a layer thickness (cm) of the deposition layer of the sample, i.e., distance between the electrodes, and a current density (A/cm$^2$) obtained from a measured current value (A) and a cross-sectional area (cm$^2$) of the current flowing region. That is, the resistivity is calculated from the following formula:

$$(\Omega cm) = (V/cm)/(A/cm^2).$$

The resistivity evaluation device used in this test example is produced by depositing a test sample (a material to be measured) 103 at a desired thickness on an ITO electrode 101 or, if necessary, an aluminum electrode having a width of about 2 mm, followed by finally depositing an aluminum electrode 102 (having a width of about 2 mm as in the above aluminum electrode) in such a manner that the aluminum electrode 102 is crossed with the ITO electrode 101.

Figure 32:
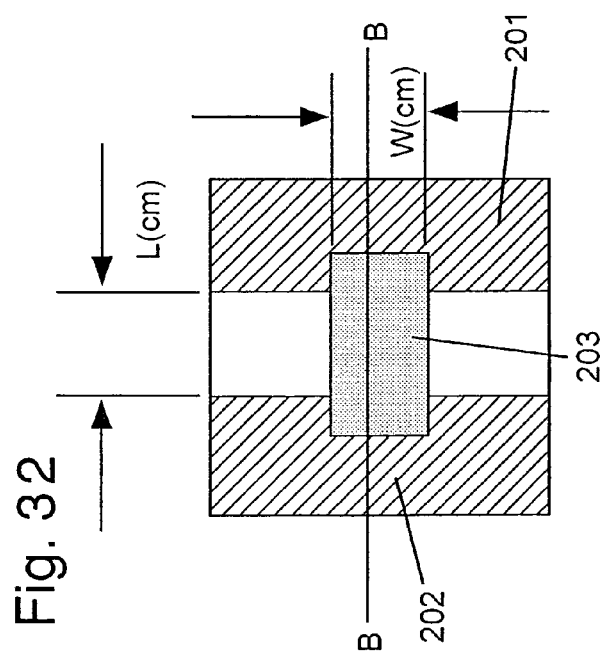
FIG. 32 is a plan view showing a device having a co-planar arrangement structure used in the evaluation of the resistivity.
Figure 33:
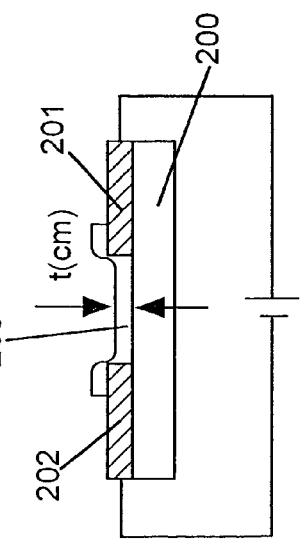
FIG. 33 is a cross-sectional view taken along line B-B of the EL device of FIG. 32.

The second measuring method (co-planar arrangement method) is a method suitable for the test samples having a relatively small resistivity, and the measurement process is carried out by using a resistivity evaluation device having a co-planar arrangement structure. Namely, as shown in FIGS. 32 and 33, a substrate 200 having previously deposited as layers on the same plane surface thereof electrodes which are used as an anode electrode layer 201 and a cathode electrode layer 202 are prepared. The anode electrode layer 201 and the cathode electrode layer 202 are disposed at a certain distance of L (cm). Thereafter, a test sample material is deposited, through a metal mask of defining a deposition area and having an opening with the certain width W (cm), on the substrate 200 to form a deposited layer 203 of the test sample having a predetermined thickness t (cm). In this method, an electric field E(V/cm) of the test sample is calculated by dividing an applied voltage (V) with a distance L (cm) between the electrodes, and a current density (A/cm$^2$) is calculated by dividing a measured current value (A) by a cross-sectional area of the current flowing region [in this example, W×t (cm$^2$)]. Using the calculated values, the resistivity (Ωcm) of the test sample can be calculated from the equation described above with regard to the first measuring method (sandwich method).

The test samples used herein are ITO (transparent electrode material); $V_2O_5$; a co-deposition layer of $V_2O_5$ and α-NPD [$V_2O_5$:α-NPD=4:1; 1:1 and 1;2 (three different molar ratios); a co-deposition layer of $V_2O_5$ and 2-TNATA [$V_2O_5$:2-TNATA=4:1 (molar ratio); a co-deposition layer of Cs and BCP [Cs:BCP=1:1 (molar ratio), an electron injection layer of the present invention]; α-NPD; and $Alq_3$. The resistivity of each of ITO, the co-deposition layer of $V_2O_5$ and α-NPD and the co-deposition layer of $V_2O_5$ and 2-TNATA is measured using the measuring device having a co-planar arrangement structure. The resistivity of each of the co-deposition layer of Cs and BCP, α-NPD and $Alq_3$ is measured using the measuring device having a sandwich structure. Furthermore, with regard to α-NPD, to make charge injection from the electrodes under the ohmic conditions, the measurement of the resistivity is carried out after forming the co-deposition layer of $V_2O_5$ and α-NPD, i.e., the hole injection layer of the present invention, at a relatively thin thickness of 50 Å in a portion adjacent to each of the electrodes, followed by sandwiching a 1,000 Å-thick α-NPD layer with the electrodes. Furthermore, the resistivity of $V_2O_5$ is measured using both of the co-planar arrangement method and the sandwich method to confirm that substantially same resistivities can be obtained regardless of the measuring methods used.

Figure 34:
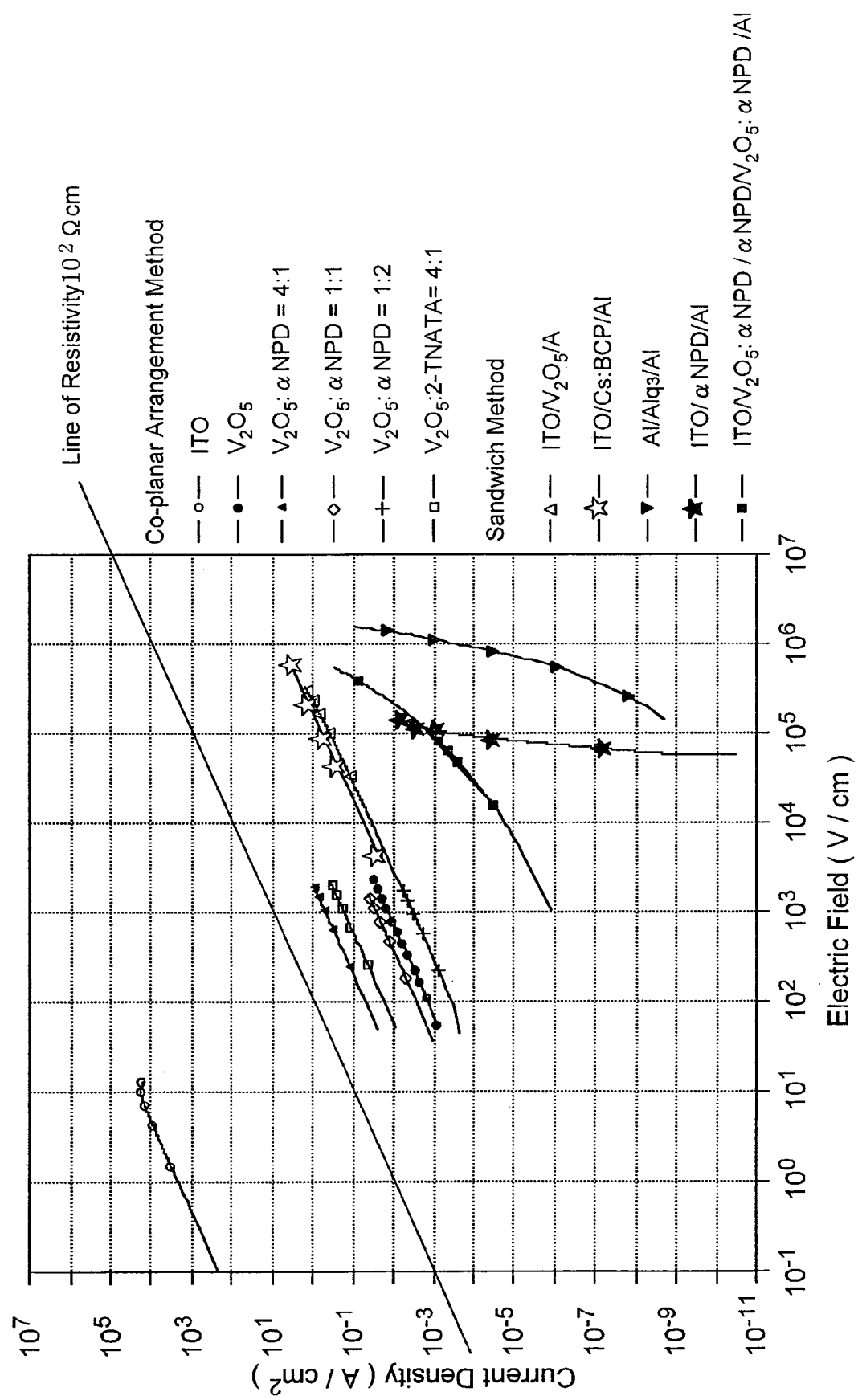
FIG. 34 is a graph showing a characteristic curve of a current density ($A/cm^2$) to an electric field (V/cm) with regard to the organic EL device according to Reference Example.

The resistivities calculated from the results plotted in FIG. 34 are as follows.

Measurement Using the Co-Planar Arrangement Method
-○-: ITO
   4.6×10$^{-4}$ Ωcm;
-●-: $V_2O_5$
   7.2×10$^4$ Ωcm;
-▲-: co-deposition layer of $V_2O_5$ and Ω-NPD=4:1
   2.0×10$^3$ Ωcm;
-◇-: co-deposition layer of $V_2O_5$ and Ω-NPD=1:1
   3.6×10$^4$ Ωcm;
-+-: co-deposition layer of $V_2O_5$ and Ω-NPD=1:2
   2.9×10$^5$ Ωcm; and
-□-: co-deposition layer of $V_2O_5$ and 2-TNATA=4:1
   5.8×10$^3$ Ωcm.

(2) Measurement Using the Sandwich Method
-△-: ITO/V$_2$O$_5$/Al
  2.8×10$^5$ Ωcm;
-☆-: ITO/Cs:BCP/Al
  1.7×10$^5$ Ωcm;
-▼-: ITO/Alq$_3$/Al
  4.8×10$^{13}$ Ωcm;
-★-: ITO/α-NPD/Al
  1.5×10$^{13}$ Ωcm; and
-■-: ITO/V$_2$O$_5$: α-NPD(50 Å)/α-NPD(1,000 Å)/V$_2$O$_5$: α-NPD(50 Å)Al
  8.0×10$^8$ Ωcm.

As can be appreciated from these results, the resistivities of the hole injection layer including V$_2$O$_5$ are within the range of not less than 1.0×10$^2$ Ωcm and less than 1.0×10$^{10}$ Ωcm.

Figure 35:
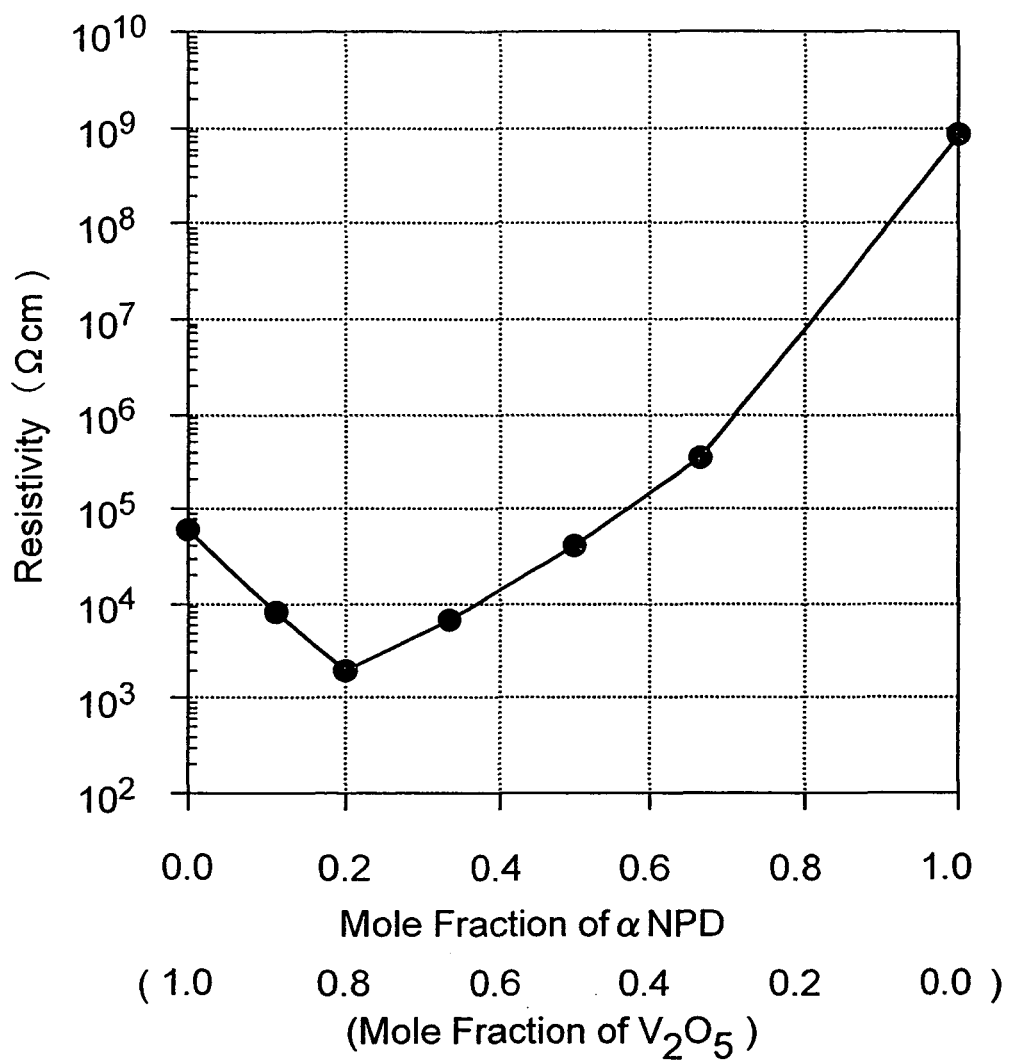
FIG. 35 is a graph showing the relationship between a mixing ratio (mole fraction) of $V_2O_5$ and α-NPD in the co-deposition layer and a resistivity ($\Omega cm$).

As is shown in FIG. 35, the hole injection layer according the above-described embodiments has a mixed layer of the metal oxide and the organic compound, and because of mixing of these two compounds, the hole injection layer shows a low resistivity which cannot be obtained with a sole use of each of the compounds. Furthermore, this fact indicates that the hole injection layer includes an oxidation-reduction reaction as a result of electron transfer therein, and thus basically evidences that the hole injection layer is effective in lowering a driving voltage and increasing an efficiency in the EL devices.

Note that in the above embodiments of the present invention, a thickness of the hole injection layer is not specifically restricted to, but it is desirable that the thickness is 5 Å or more. In the hole injection layer, its thickness has no upper limit because the arylamine compound is contained in a state of radical cations which can act as an internal charge in the hole injection layer even when no electric field is applied to the device. Furthermore, even if the thickness of the hole injection layer is increased, because of its lower resistivity, the hole injection layer does not cause an increase of the voltage of the EL device, and therefore, when a distance between the electrodes is extended to be larger than that of conventional organic EL devices, the hole injection layer is useful for largely reducing a risk of the short-circuit in EL devices. Accordingly, the organic EL devices of the present invention can be operated at a low voltage as in the conventional organic EL devices, even if a total thickness of the layers between the electrodes is increased to not less than about 2,000 Å.

As can be appreciated from the above detailed descriptions of the present invention, according to the present invention, a driving voltage of the organic EL devices can be reduced by lowering an energy barrier during hole injection from the anode electrode layer to the organic compound layer, and at the same time, a risk of the electrical short-circuit between the cathode electrode layer and the anode electrode layer can be considerably diminished by controlling the thickness of the hole injection layer. Furthermore, it becomes possible for the hole injection layer, which is a mixed layer of the metal oxide compound and the organic compound, to act as a buffer layer for reducing damages due to high energy particles caused in the formation of the electrodes using the sputtering method. Furthermore, it becomes possible to attain a low voltage driving and stable driving of the EL devices by disposing the hole injection layer as a layer in adjacent to the anode electrode layer. Moreover, since a value of the work function of the electrode (anode electrode layer), which is used to be one factor of controlling the driving voltage and light emission efficiency in prior art organic EL devices, can be ignored, it becomes possible to diversify the selectivity of the anode electrode material for the production of the EL devices. On the other hand, when the mixed layer is used as a hole injection layer in adjacent to the anode electrode layer, since the organic molecules used in the formation of the mixed layer such as arylamines have been already in the state of radical cations, it becomes possible to inject holes into the organic structure including a light-emissive layer without suffering from an energy barrier during application of the voltage, regardless of the types of the anode electrode material used.

Obvious changes may be made in the specific embodiments of the present invention described herein, such modifications being within the spirit and scope of the invention claimed. It is indicated that all matter contained herein is illustrative and does not limit the scope of the present invention.

The invention claimed is:
1. An organic electroluminescent device comprising:
an anode electrode layer;
a cathode electrode layer opposed to the anode electrode layer; and
an organic structure including at least one light-emissive unit, each light-emissive unit having a hole injection layer on an anode, a hole transportation layer adjacent the hole injection layer, a light-emissive layer adjacent the hole transportation layer, and an electron injection layer adjacent the light-emissive layer on a cathode side, the organic structure further including a charge generation layer partitioning each light-emissive unit from a subsequent light-emissive unit;
wherein the hole injection layer is capable of diminishing an energy barrier generated during injection of holes from the anode;
wherein at least one of the anode electrode layer and the cathode electrode layer is transparent;
wherein the hole injection layer consists essentially of a mixed layer of a metal oxide and an organic compound, and the thickness of the hole injection layer is at least about three hundred (300) angstroms;
wherein the mixed layer is formed upon co-deposition of the metal oxide and the organic compound at a molar ratio of about 4:1;
wherein the mixed layer acts as a damage-diminishing layer;
wherein the organic compound in the mixed layer comprises an arylamine compound represented by the general formula (I):

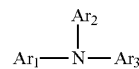

wherein Ar.sub.1, Ar.sub.2 and Ar.sub.3 each independently represents an aromatic hydrocarbon group which can be substituted and wherein the organic compound has an ionization potential of less than 5.7 eV and has a hole transporting property;
wherein the mixed layer includes a charge transfer complex having a radical cation of the organic compound and a radical anion of the metal oxide, the charge transfer complex being produced upon an oxidation-reduction reaction between the metal oxide and the organic compound; and
wherein the radical cation in the charge transfer complex is moved to a direction of the cathode electrode layer during application of the voltage to the EL device, thereby injecting holes in the light-emissive layer.

2. The organic electroluminescent device according to claim 1, wherein the organic compound is a porphyrin compound including a phthalocyanine derivative.

3. The organic electroluminescent device according to claim 1, wherein the organic compound is an arylamine compound having a glass transition temperature of not less than 90° C.

4. The organic electroluminescent device according to claim 3, wherein the arylamine compound used as the organic compound comprises one of α-NPD, 2-TNATA, spiro-TAD and spiro-NPB.

5. The organic electroluminescent device according to claim 1, wherein the metal oxide comprises one of $V_2O_5$ and $Re_2O_7$.

6. The organic electroluminescent device according to claim 1, wherein the EL device comprises a substrate having laminated thereon the anode electrode layer, the hole injection layer, and an organic structure including the light-emissive layer and the cathode electrode layer, in that order.

7. The organic electroluminescent device according to claim 1, wherein the EL device comprises a substrate having laminated thereon the cathode electrode layer, an organic structure comprising the light-emissive layer, the hole injection layer and the anode electrode layer, in that order.

8. The organic electroluminescent device according to claim 6, wherein a mixing ratio of the metal oxide and the organic compound in the hole injection layer is continuously varied from the anode electrode layer to the organic structure including the light-emissive layer.

9. The organic electroluminescent device according to claim 7, wherein a mixing ratio of the metal oxide and the organic compound in the hole injection layer is continuously varied from the anode electrode layer to the organic structure including the light-emissive layer.

10. The organic electroluminescent device according to claim 6, wherein a mixing ratio of the metal oxide and the organic compound in the hole injection layer is discontinuously varied from the anode electrode layer to the organic structure including the light-emissive layer.

11. The organic electroluminescent device according to claim 7, wherein a mixing ratio of the metal oxide and the organic compound in the hole injection layer is discontinuously varied from the anode electrode layer to the organic structure including the light-emissive layer.

12. The organic electroluminescent device according to claim 7, wherein the anode electrode layer is formed with a sputtering method, and the mixed layer acts as a buffer layer for reducing damage of the EL device during the sputtering process.

13. The organic electroluminescent device according to claim 12, wherein a sputtering apparatus used in the sputtering method comprises a facing target sputtering system which includes a pair of opposed targets provided at a predetermined distance apart, a reflection electrode capable of reflecting electrons towards a front peripheral area of each target, and a magnetic field generation medium capable of forming a parallel magnetic field in a neighborhood of the peripheral portion of each target, the magnetic field having a portion parallel to the peripheral portion of the target.

14. The organic electroluminescent device according to claim 1, wherein the metal oxide is vaporized with one of a resistive heating vapor deposition method, an electron beam vapor deposition method and a laser beam vapor deposition method.

15. The organic electroluminescent device according to claim 1, wherein the hole injection layer which is a mixed layer of the metal oxide and the organic compound has a resistivity of not less than $1.0 \times 10^2$ Ωcm and less than $1.0 \times 10^{10}$ Ωcm.

16. An organic electroluminescent device comprising:
an anode electrode layer;
a cathode electrode layer opposed to the anode electrode layer;
an organic structure including at least one light-emissive unit, each light-emissive unit having a hole injection layer on an anode, a hole transportation layer adjacent the hole injection layer, a light-emissive layer adjacent the hole transportation layer, and an electron injection layer adjacent the light-emissive layer on a cathode side, and the organic structure further including a charge generation layer adjacent the electron injection layer and partitioning the at least one light-emissive unit;
wherein the hole injection layer is capable of diminishing an energy barrier generated during injection of holes from the anode;
wherein at least one of the anode electrode layer and the cathode electrode layer is transparent;
wherein the hole injection layer consists essentially of a mixed layer of a metal oxide and an organic compound, and the thickness of the hole injection layer is at least about three hundred (300) angstroms;
wherein the mixed layer is formed upon co-deposition of the metal oxide and the organic compound at a molar ratio of about 4:1;
wherein the organic compound in the mixed layer comprises an arylamine compound represented by the general formula (I):

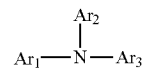

wherein $Ar_1$, $Ar_2$ and $Ar_3$ each independently represents an aromatic hydrocarbon group which can be substituted and the organic compound has an ionization potential of less than 5.7 eV and has a hole transporting property;
wherein the mixed layer includes a charge transfer complex having a radical cation of the organic compound and a radical anion of the metal oxide, the charge transfer complex being produced upon an oxidation-reduction reaction between the metal oxide and the organic compound; and
wherein the radical cation in the charge transfer complex is moved to a direction of the cathode electrode layer during application of the voltage to the EL device, thereby injecting holes in the light-emissive layer.

* * * * *